(12) United States Patent
Liang et al.

(10) Patent No.: US 11,145,591 B2
(45) Date of Patent: Oct. 12, 2021

(54) INTEGRATED CIRCUIT (IC) DEVICE INTEGRAL CAPACITOR AND ANTI-FUSE

(71) Applicant: International Business Machines Corporation, Armonk, NY (US)

(72) Inventors: Jim Shih-Chun Liang, Poughkeepsie, NY (US); Baozhen Li, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 16/686,916

(22) Filed: Nov. 18, 2019

(65) Prior Publication Data

US 2021/0151373 A1   May 20, 2021

(51) Int. Cl.
*H01L 49/02* (2006.01)
*H01L 23/525* (2006.01)
*H01L 23/522* (2006.01)

(52) U.S. Cl.
CPC ...... *H01L 23/5223* (2013.01); *H01L 23/5226* (2013.01); *H01L 23/5252* (2013.01); *H01L 28/40* (2013.01)

(58) Field of Classification Search
CPC .............. H01L 23/5223; H01L 23/5226; H01L 23/5252; H01L 28/40
See application file for complete search history.

(56) References Cited

U.S. PATENT DOCUMENTS

| | | | | |
|---|---|---|---|---|
| 5,508,220 A | * | 4/1996 | Eltoukhy | H01L 23/5252 148/DIG. 55 |
| 5,625,219 A | * | 4/1997 | Takagi | H01L 23/5252 257/209 |
| 6,081,021 A | * | 6/2000 | Gambino | H01L 21/76838 257/530 |
| 6,115,283 A | * | 9/2000 | Hidaka | G11C 17/18 365/149 |

(Continued)

FOREIGN PATENT DOCUMENTS

WO    2013085815 A1    6/2013

OTHER PUBLICATIONS

Yang et al., "Metal-to-metal antifuse with low programming voltage and low on-state resistance", 2016 Chinese Institute of Electronics.

*Primary Examiner* — Earl N Taylor
(74) *Attorney, Agent, or Firm* — ZIP Group PLLC

(57) ABSTRACT

An IC device includes an integrated capacitor and anti-fuse. Prior to programming of the anti-fuse, electrical current is configured to flow siloed between a first circuit element and a second circuit element through a first VIA. The anti-fuse may be programed by applying a fusing voltage to a second VIA to charge an anti-fuse plate. Within the anti-fuse, the anti-fuse plate is separated from the first capacitor plate by a dielectric. The fusing voltage causes an electric field between the plates to exceed a breakdown field strength of the dielectric which results in an electric arc between the anti-fuse plate and the capacitor plate. The electric arc fuses or otherwise joins the anti-fuse plate and the capacitor plate. Functionality of the IC device may be altered by allowing or driving current from the first circuit element or the second circuit element across the fused plates.

12 Claims, 11 Drawing Sheets

(56) References Cited

U.S. PATENT DOCUMENTS

| | | | |
|---|---|---|---|
| 6,495,426 B1* | 12/2002 | Cheng | H01L 23/5258 257/E21.008 |
| 6,680,520 B2* | 1/2004 | Voidman | H01L 23/5223 257/223 |
| 6,709,918 B1* | 3/2004 | Ng | H01L 23/5223 257/E21.004 |
| 6,730,573 B1* | 5/2004 | Ng | H01L 23/5223 438/381 |
| 6,750,530 B1* | 6/2004 | Klaasen | H01L 23/5252 257/530 |
| 6,833,604 B2* | 12/2004 | Tsau | H01L 21/76807 257/532 |
| 6,902,972 B2* | 6/2005 | Tsau | H01L 21/76807 257/E23.147 |
| 7,187,015 B2* | 3/2007 | Tsau | H01L 21/76807 257/211 |
| 7,239,004 B2* | 7/2007 | Park | H01L 23/5223 257/529 |
| 7,649,241 B2* | 1/2010 | Jung | H01L 28/60 257/530 |
| 7,968,967 B2 | 6/2011 | Wang et al. | |
| 9,209,194 B1* | 12/2015 | Ikeda | H01L 27/10897 |
| 9,627,312 B2 | 4/2017 | Childs et al. | |
| 10,020,313 B2 | 7/2018 | Lee et al. | |
| 10,770,159 B2* | 9/2020 | Huang | G11C 29/70 |
| 2002/0038903 A1* | 4/2002 | Tsau | H01L 23/53228 257/532 |
| 2002/0100907 A1 | 8/2002 | Wang | |
| 2002/0113297 A1* | 8/2002 | Voidman | H01L 23/5223 257/665 |
| 2004/0115875 A1* | 6/2004 | Voidman | H01L 23/5252 438/200 |
| 2004/0129999 A1* | 7/2004 | Jung | H01L 23/5223 257/532 |
| 2004/0147087 A1* | 7/2004 | Cheng | H01G 4/005 438/396 |
| 2004/0232520 A1* | 11/2004 | Tsau | H01L 23/5223 257/532 |
| 2005/0161765 A1* | 7/2005 | Tsau | H01L 23/5223 257/528 |
| 2006/0097580 A1* | 5/2006 | Fischer | H01L 27/0805 307/109 |
| 2008/0012138 A1* | 1/2008 | Wang | H01L 23/5252 257/758 |
| 2009/0294903 A1* | 12/2009 | Shih | H01L 27/0733 257/530 |
| 2012/0112312 A1* | 5/2012 | Perry | H01L 21/76898 257/530 |
| 2013/0083586 A1* | 4/2013 | Petitprez | H01L 23/576 365/102 |
| 2019/0057754 A1 | 2/2019 | Huang et al. | |
| 2019/0304894 A1 | 10/2019 | Dorgan et al. | |
| 2021/0151373 A1* | 5/2021 | Liang | H01L 28/40 |

* cited by examiner

INTEGRATED CIRCUIT (IC) DEVICE INTEGRAL CAPACITOR AND ANTI-FUSE

FIELD

Embodiments of invention generally relate to integrated circuit (IC) devices and IC device fabrication methods. More particularly, embodiments relate to IC devices with an integrated capacitor and anti-fuse.

SUMMARY

In an embodiment of the present invention, a method of programming an on integrated circuit (IC) device integrated capacitor and anti-fuse structure is presented. The method includes applying a fusing voltage to a fuse vertical interconnect access (VIA) to charge an anti-fuse plate and fusing the anti-fuse plate and a capacitor plate.

In another embodiment of the present invention, an on integrated circuit (IC) device integrated capacitor and anti-fuse structure is presented. The structure includes an anti-fuse directly adjacent to a capacitor. The anti-fuse includes an anti-fuse plate. The capacitor includes a capacitor plate that extends from within the capacitor to within the anti-fuse. The anti-fuse plate is separated from the capacitor plate within the anti-fuse by a dielectric. The anti-fuse plate is configured to receive a fusing voltage that causes a charge thereupon that exceeds a breakdown field strength of the dielectric and that causes the anti-fuse plate to fuse with the capacitor plate.

In another embodiment of the present invention, an integrated circuit (IC) device is presented. The IC device includes an anti-fuse directly adjacent to a capacitor. The anti-fuse includes an anti-fuse plate. The capacitor includes a capacitor plate that extends from within the capacitor to within the anti-fuse. The anti-fuse plate is separated from the capacitor plate within the anti-fuse by a dielectric. The anti-fuse plate is configured to receive a fusing voltage that causes a charge thereupon that exceeds a breakdown field strength of the dielectric and that causes the anti-fuse plate to fuse with the capacitor plate.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to IC devices, such as wafers, processors, application specific integrated circuits (ASICs), field programmable gate arrays (FPGAs), or the like that include an integrated capacitor and anti-fuse structure. Prior to programming of the anti-fuse, electrical current is configured to flow siloed between a first circuit element and a second circuit element through a first VIA. The first capacitor plate may be part of an on IC device capacitor within a capacitor region of the IC device. The anti-fuse may be programed by applying a fusing voltage to a second VIA to charge an anti-fuse plate that is connected to the second VIA. The anti-fuse plate may be located within an anti-fuse region that neighbors the capacitor region. Within the anti-fuse region, the anti-fuse plate is separated from the first capacitor plate by a dielectric. The fusing voltage causes an electric field between the plates to exceeds a breakdown field strength of the dielectric which results in an electric arc between the anti-fuse plate and the capacitor plate. The electric arc fuses or otherwise joins the anti-fuse plate and the capacitor plate. Functionality of the IC device may be altered by allowing or driving current from the first circuit element or the second circuit element across the fused plates to a third circuit element that which the first or second circuit element would not have otherwise been electrically connected to but for the fusing of the anti-fuse plate and the capacitor plate.

Fabrication processes are disclosed where the integrated capacitor and anti-fuse structure are assembled and coupled with IC devices. The capacitor embodiments allow for IC device designers to decouple interfacing challenges such as between logic devices and memory devices during the packaging process. The newly fused plates allow for functionality of the IC device to be altered or the like. Anti-fuse elements may be integrated with capacitor elements during similar or same fabrication stages. For example, the capacitor plate and the anti-fuse plate may be patterned and formed from the same conductive sheet and may thus be deemed as being formed simultaneously.

Figure 1:
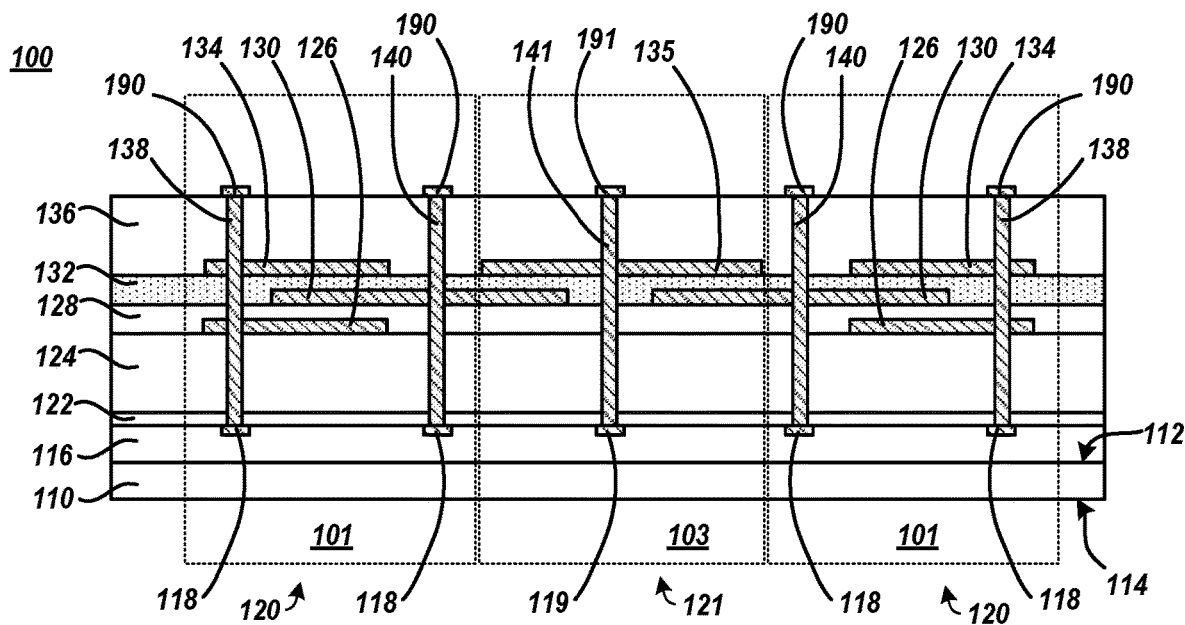
FIG. 1 is a cross-section elevation view of an on IC device integrated capacitor and anti-fuse structure, according to an exemplary embodiment.

FIG. 1 is a cross-section elevation view of an on IC device 100 integrated capacitor and anti-fuse structure, according to an exemplary embodiment. IC device 100 includes a capacitor region 101 and an anti-fuse region 103. The anti-fuse region 103 may be directly adjacent, or neighboring, the capacitor region 101. The anti-fuse region 103 may separate a pair of capacitor regions 101. In the present embodiment, IC device 100 integrated capacitor and anti-fuse structure includes an anti-fuse plate 135 formed along with a third capacitor plate 134. The anti-fuse region 103 may be defined by the width of anti-fuse plate 135, as depicted whereby the side surfaces of the anti-fuse are coplanar with the side boundaries of anti-fuse region 103.

A semiconductor substrate 110 includes an active surface 112 and a backside surface 114 as well as a back-end (BE) metallization layer 116. In embodiments, the semiconductor substrate 110 is a semiconductor material such as but not limited to silicon (Si), silicon germanium (SiGe), germanium (Ge), or III-V compound semiconductors. The semiconductor substrate 110 can be monocrystalline, epitaxial crystalline, or polycrystalline. In embodiments, the semiconductor substrate 110 is a semiconductor heterostructure such as but not limited to a silicon-on-insulator (SOI) substrate, or a multi-layered substrate comprising silicon, silicon germanium, germanium, III-V compound semiconductors, and any combinations thereof. Active devices are located at the active surface 112 and they refer to components such as but not limited to gates, transistors, rectifiers, and isolation structures that form parts of integrated circuits. The active devices are coupled as functional circuits by the BE metallization layer 116.

The BE metallization layer 116 may also be referred to as a BE interconnect stack. The BE metallization 116 may include metal circuit traces, such as from metal-1 (M1) up to metal-n (Mn) such as M11, but not limited to M11. In embodiments, an upper metallization trace 118, 119 is the Mn metallization. The BE metallization layer 116 is illustrated in simplified form, but it comprises multiple levels of interconnects that are isolated from one another by multiple layers of interlayer dielectric (ILD) materials, as is known in the art.

An on IC device capacitor structure 120 is disposed above and on the BE metallization layer 116 within capacitor region 101 and an on IC device anti-fuse structure 121 is disposed above and on the BE metallization layer 116 within anti-fuse region 103. In embodiments, a via etch-stop first layer 122 is formed upon the upper metallization trace 118, 119 as it is exposed through the BE metallization layer 116. Thereafter, a first vertical interconnect access (VIA) interlayer dielectric (ILD) layer 124 is disposed above the upper metallization trace 118, 119. In this embodiment, the first VIA ILD layer 124 is disposed above and on the via etch-stop first layer 122. In embodiments, the via etch-stop first layer 122 is made of a material such as silicon carbide. Other materials may be chosen for the via etch-stop first layer 122 depending upon a given useful application of disclosed embodiments.

A patterned capacitor plate 126 is formed upon the first VIA ILD 124 within capacitor regions 101. A capacitor first dielectric layer 128 is formed upon the VIA ILD 124 and over the patterned capacitor plate 126 within the capacitor regions 101 and is formed upon the VIA ILD 124 within anti-fuse region 103. The capacitor plate 126 may include one or more VIA pilot holes within the plate 126 in desired VIA location(s) to assist in the fabrication or etching of VIA trenches in a subsequent fabrication stage.

A patterned capacitor plate 130 is formed upon the capacitor first dielectric layer 128 and has an effective portion that is substantially parallel-planar with the patterned capacitor plate 126. The patterned capacitor plate 130 is formed upon the capacitor first dielectric layer 128 in the capacitor region 101 and in the anti-fuse region 103. In other words, the capacitor plate 130 is formed within the capacitor region 101 and at least partially extends into the neighboring anti-fuse region 103. The capacitor 120 and anti-fuse 121 share the capacitor plate 130 and are thus deemed integrated in accordance with various embodiments of the present invention. The capacitor plate 130 may include one or more VIA pilot holes within the plate 126 in desired VIA location(s) to assist in the fabrication or etching of VIA trenches in a subsequent fabrication stage.

A capacitor second dielectric layer 132 is formed upon the capacitor first dielectric layer 128 and over the patterned capacitor plate 130. A patterned capacitor plate 134 is formed upon the capacitor second dielectric layer 132 within the capacitor region 101 and has an effective portion that is substantially parallel-planar with the patterned capacitor plate 130. A patterned anti-fuse plate 135 is formed upon the capacitor second dielectric layer 132 within the anti-fuse region 103 and has an effective portion that is substantially parallel-planar with the patterned capacitor plate 130. The capacitor plate 134 and the anti-fuse plate 135 may be formed in the same or otherwise shared fabrication stage. A second VIA ILD layer 136 is formed upon the capacitor second dielectric layer 132 and over the patterned capacitor plate 134 and over the patterned anti-fuse plate 135. The capacitor plate 134 and/or anti-fuse plate 135 may include one or more VIA pilot holes within the plate 126 in desired VIA location(s) to assist in the fabrication or etching of VIA trenches in a subsequent fabrication stage.

Electrically conductive materials may be selected to obtain useful capacitor embodiments. In embodiments, the plates 126, 130, 134, 135 are made from a metal. In embodiments, the plates are a copper composition. In embodiments, the plates are a titanium nitride (TixNy) composition where x and y may be chosen to make up either stoichiometric or non-stoichiometric ratios. In embodiments, the plates are made of titanium. In embodiments, the plates are made of tantalum. In embodiments, the capacitor plate 126 is a tantalum nitride (TaxNy) composition where x and y may be chosen to make up either stoichiometric or non-stoichiometric ratios.

In embodiments, plate 126, 130, 134, 135 thickness is in a range from 20 to 50 nanometer (nm). Dielectric materials may be selected to obtain useful capacitor embodiments. In embodiments, a high-k dielectric (k>6) is used. In embodiments, a capacitor dielectric material is an oxide. In embodiments, a capacitor dielectric material is silicon dioxide (SiO2). In embodiments, a capacitor dielectric material is a hafnium oxide (HfxOy) where x and y may be chosen to make up either stoichiometric or non-stoichiometric ratios. In embodiments, a capacitor dielectric material is an aluminum oxide (AlxOy) where x and y may be chosen to make up either stoichiometric or non-stoichiometric ratios.

In embodiments, a capacitor dielectric material is a lead zirconate titanate (PZT) material. In embodiments, a capacitor dielectric material is a barium strontium titanate (BST) material.

In embodiments, a mixture of oxides is used such as one oxide for the capacitor dielectric first layer 128 and a different oxide for the capacitor dielectric second layer 132. In embodiments, a given capacitor dielectric layer is a mixture of two or more oxides. In an example embodiment, the capacitor dielectric first layer 128 is a hafnium oxide and the capacitor dielectric second layer 132 is an aluminum oxide. It may now be understood by these examples that a capacitor dielectric first layer 128 may be of a first composition such as hafnium oxide and the capacitor dielectric second layer 132 may be of a second composition such as aluminum oxide. One layer may be of "the same" as the other layer such as identical chemistries. One layer may be "different" from the other layer such as the same qualitative chemistries but of different stoichiometries. One layer may be "different" from the other layer such as the different qualitative chemistries such as a hafnium oxide in one and an aluminum oxide in the other. One layer may be "different" from the other layer such as the different qualitative chemistries such as a halfnium oxide in one and a mixture of an aluminum oxide and halfnium oxide in the other. One layer may be "different" from the other layer such as the different qualitative chemistries such as an aluminum oxide in one and a mixture of an aluminum oxide and halfnium oxide in the other. By these embodiments it should be understood that other dielectric materials may be mixed and matched where different capacitances are useful between the several plates.

Electrical coupling of the capacitor structure 120 between the semiconductor substrate 110 and the outside world is accomplished by a power via 138 and a ground via 140. As illustrated in this embodiment, the power via 138 is in contact with both the patterned capacitor plate 126 and the patterned capacitor plate 134. Grounding is accomplished in this embodiment by direct contact between the ground via 140 and the patterned capacitor plate 130.

Electrical coupling of the anti-fuse structure 121 between the semiconductor substrate 110 and the outside world is accomplished by an anti-fuse via 141. As illustrated in this embodiment, the anti-fuse via 141 is in contact with anti-fuse plate 135. VIAs 138, 140, and 141 may be fabricated in the same or a shared fabrication stage.

In embodiments, the VIAs 138, 140, 141 may have a VIA liner adhesion layer that assists in making a useful bond between the VIAs and adjacent structures. Formation of the VIA liner adhesion layer may be done by a chemical vapor deposition of a liner material such as titanium or tungsten. In embodiments, the adhesion layer is titanium. In embodiments, the adhesion layer is titanium tungsten (TiW). In embodiments, the adhesion layer is tantalum. In embodiments, the adhesion layer may be a bilayer. For example, the adhesion layer may be a bilayer of Tantalum Nitride and Tantalum deposited by chemical or physical vapor deposition. Thickness of the adhesion layer may be useful in a range from 50 to 500 Angstrom (Å) according to embodiments.

In embodiments, the VIAs 138, 140, 141 are filled copper pillars. Electrical coupling of the VIA 138, 140, 141 to external electrical features may be accomplished in embodiments by electrical bumps that are disposed on pads that contact the VIAs, as is known in the art. The electrical bumps may be solder and part of a controlled-collapse chip connection (C4) that can be attached to conductive traces of an IC device carrier, or the like. In embodiments, the electrical bumps have a diameter in a range from 50 to 100 μm.

It may now be understood that the on IC device capacitor structure 120 and on anti-fuse structure 121 may be coupled above the second VIA ILD 136 to further materials instead of to a bump. For example, additional BE metallization may be fabricated above the second VIA ILD 136. In embodiments, the upper portion of the VIAs 138, 140, 141 are contacted by metallization traces or contacts instead of the pads.

It may now be appreciated that the power via 138 may be referred to as a first via 138 coupled to the capacitor plate 126 and the capacitor plate 134. Similarly, but according to this embodiment, the ground via 140 may be referred to as a second via 140 coupled to the capacitor plate 130. It may now be appreciated that the anti-fuse via 141 may be referred to as a third via 141 coupled to the anti-fuse plate 135.

It may now also be appreciated that the respective first- and second VIAs 138 and 140 each penetrate and contact two metal layers while connecting between the semiconductor substrate 110 and the outside world. In FIG. 1, the first via 138 penetrates and contacts at a first-plate 126 contact point and penetrates and contacts at a third plate 134 contact point. Also, the second via 140 penetrates and contacts at a second-plate 130 contact point. Further, the third via 141 penetrates and contacts at a fourth plate 135 contact point.

In embodiments, the on IC device capacitor 120 is used as a decoupling capacitor. The decoupling capacitor can be formed between power (+V) and ground (gnd) to decouple a circuit found in the semiconductor substrate 110 without changing or affecting an existing circuit layout in the silicon. In embodiments, the on IC device capacitor 100 is used as a noise filter. In embodiments, the on IC device capacitor 120 is used as a sensor. In embodiments, the IC device capacitor 120 is a metal-insulator-metal-insulator-metal (MIMIM or MIM IM1) structure.

In embodiments, the on IC device anti-fuse 121 is used as a decoupling capacitor, prior to the anti-fuse 121 being programmed. The anti-fuse 121 can be formed between power (+V) and ground (gnd) to decouple a circuit found in the semiconductor substrate 110 without changing or affecting an existing circuit layout in the silicon, prior to the anti-fuse 121 being programmed. In embodiments, the on IC device anti-fuse 121 is used as a noise filter, prior to the anti-fuse 121 being programmed. In embodiments, the on IC device anti-fuse 121 is used as a sensor, prior to the anti-fuse 121 being programmed. In embodiments, the IC device anti-fuse 121 is a MIM structure, MIMIM structure, or the like, prior to the anti-fuse 121 being programmed.

Figure 2:
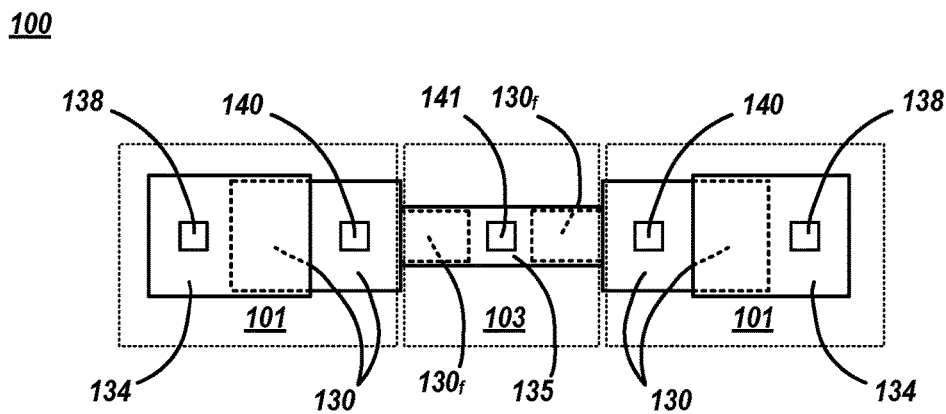
FIG. 2 is a top plan cut-away view of the integrated capacitor and anti-fuse structure depicted in FIG. 1, according to an exemplary embodiment.

FIG. 2 is a top plan cut-away view of the integrated capacitor and anti-fuse structure depicted in FIG. 1, according to an exemplary embodiment. For illustration purposes, several structures are not shown in order to better describe selected structures.

In capacitor region 101, the second plate 130 is shown partially obscured (as phantom lines) by the third plate 134. As depicted, the third plate 134 is contacted by the power via 138, and the second plate 130 is contacted by the ground via 140. The first plate 126 is not depicted in FIG. 2, but it would be disposed below the second plate 130 as seen in FIG. 1.

In anti-fuse region 103, the second plate 130 extends into the anti-fuse structure 121. The region of second plate 130 within anti-fuse structure 121 may be denoted as second plate $130_f$. Second plate $130_f$ is shown partially obscured (as phantom lines) by anti-fuse plate 135. As depicted, the anti-fuse plate 135 is contacted by the anti-fuse via 141, and the second plate $130_f$ is contacted by the ground via 140. As depicted, the front-to-back dimension of second plate $130_f$ may be less than the same front-to-back dimension of second plate 130 within the capacitor structure 120. In other words, the front and rear side surfaces of second plate $130_f$ may be inset from respective front and rear side surfaces of second plate 130 within the capacitor structure 120. The front and rear side surfaces of anti-fuse plate 135 may be substantially coplanar (i.e. coplanar within an appropriate fabrication tolerance) with respective front and rear side surfaces of second plate $130_f$. The relatively smaller top/bottom surface area of second plate $130_f$ relative to the respective top/bottom surface area of second plate 130 within capacitor structure 120 may concentrate electrical charge of anti-fuse plate 135 within the anti-fuse structure 121 and cause the electrical arc/fusing between the anti-fuse plate 135 and second plate $130_f$, upon the programming of anti-fuse structure 121.

Figure 3:
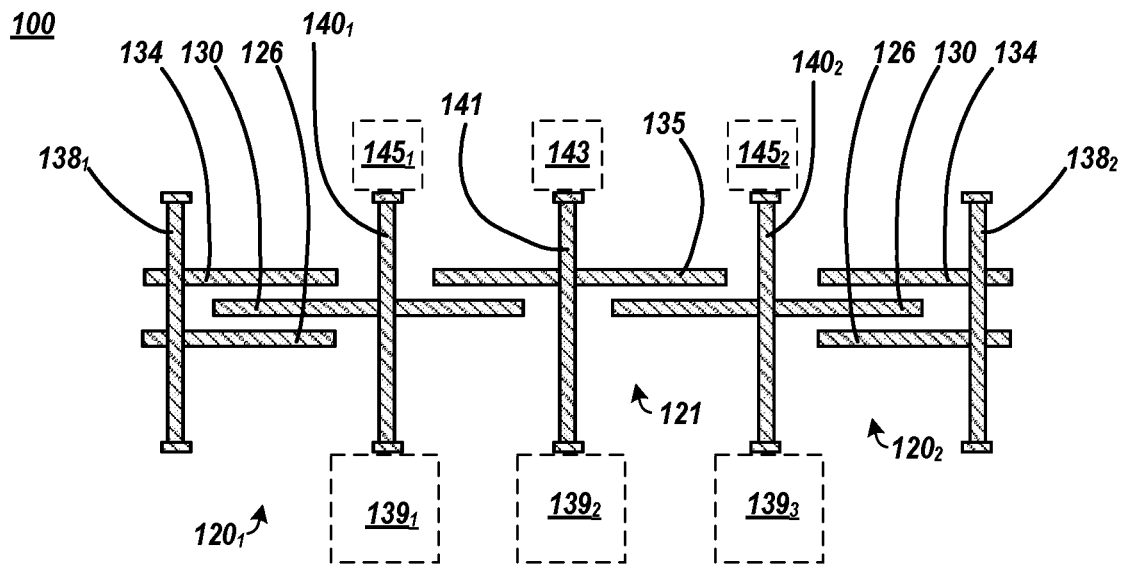
FIG. 3 is a cross-section cut-away view of an on IC device integrated capacitor and anti-fuse structure, according to an exemplary embodiment.

FIG. 3 is a cross-section cut-away view of an on IC device 100 integrated capacitor and anti-fuse structure, according to an exemplary embodiment prior to anti-fuse 121 being programmed. IC device 100 may include enumerated VIAs $138_1$, $140_1$ within capacitor $120_1$, enumerated VIAs $138_2$, $140_2$ within capacitor $120_2$, and VIA 141 within anti-fuse 121 that separates pair of capacitors $120_1$, $120_2$.

VIA $140_1$ is connected to external circuit element(s) $145_1$ and to active device(s) $139_1$. In embodiments, external circuit element(s) $145_1$ may be a C4 connection, an IC device 100 carrier or interposer contact, a system board contact, a mother board contact, or the like and active device(s) $139_1$ may be gates, transistors, rectifiers, isolation structures, etc. that form parts of an integrated circuit, an entire integrated circuit itself, or multiple integrated circuits, or the like.

VIA $140_2$ is connected to external circuit element(s) $145_2$ and to active device(s) $139_3$. In embodiments, external circuit element(s) $145_2$ may be a C4 connection, an IC device 100 carrier or interposer contact, a system board contact, a mother board contact, or the like and active device(s) $139_3$ may be gates, transistors, rectifiers, isolation structures, etc. that form parts of an integrated circuit, an entire integrated circuit itself, or multiple integrated circuits, or the like.

VIA 141 is connected to external circuit element(s) 143 and to active device(s) $139_2$. In embodiments, external circuit element(s) 143 may be a C4 connection, an IC device 100 carrier or interposer contact, a system board contact, a mother board contact, or the like and active device(s) $139_2$ may be gates, transistors, rectifiers, isolation structures, etc. that form parts of an integrated circuit, an entire integrated circuit itself, or multiple integrated circuits, or the like.

Prior to programming of anti-fuse 121, external circuit element(s) $145_1$ is in electrical communication with active device(s) $139_1$ and may be electrically separated or distinct from external circuit element(s) 143, $145_2$, and may be electrically separated or distinct from active device(s) $139_2$, $139_3$, external circuit element(s) $145_2$ is in electrical communication with active device(s) $139_3$ and may be electrically separated or distinct from external circuit element(s) 143, $145_1$, and may be electrically separated or distinct from active device(s) $139_1$, $139_2$; and external circuit element(s) 143 is in electrical communication with active device(s) $139_2$ and may be electrically separated or distinct from external circuit element(s) $145_1$, $145_2$, and may be electrically separated or distinct from active device(s) $139_1$, $139_3$.

Figure 4A:
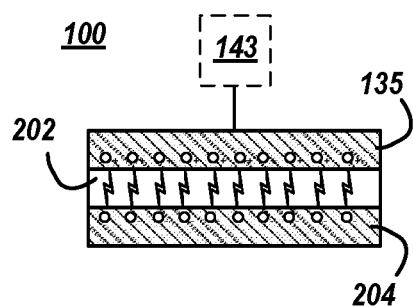
FIG. 4A and FIG. 4B are detailed cross-section elevation views of an on IC device integrated capacitor and anti-fuse structure, according to an exemplary embodiments.
Figure 4B:
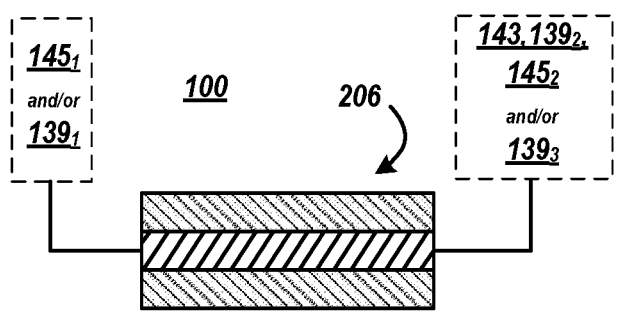

FIG. 4A and FIG. 4B are detailed cross-section elevation views of an on IC device 100 integrated capacitor and anti-fuse structure, according to an exemplary embodiments, subsequent to the programming of anti-fuse 121. In the depicted embodiment, anti-fuse 121 includes anti-fuse plate 135 that is separated from anti-fuse plate 204 by dielectric 202. Depending upon the implementation, anti-fuse plate 204 may be first plate $126_f$, second plate $130_f$, or third plate $134_f$ of capacitor 120 that extends into anti-fuse region 103. Likewise, depending upon the implementation dielectric 202, may be first dielectric layer 128 or second dielectric layer 132.

Anti-fuse 121 may be programmed by external circuit element(s) 143 applying a fusing voltage to charge anti-fuse plate 135. The fusing voltage charges anti-fuse plate 135 which causes an electric field between the anti-fuse plate 135 and capacitor plate 204 to exceeds a breakdown field strength of the dielectric 202. The electric field may be such that causes an electric arc between the anti-fuse plate 135 and the capacitor plate 204 as depicted in FIG. 4A. As depicted in FIG. 4B, the electric arc fuses or otherwise joins the anti-fuse plate 135 and the capacitor plate 204 resulting fused plates 206. As plates 135 and 204 are fused, fused plates 206 effectively operates as a single conductor or a single electrical pathway, as opposed to the separate or distinct electrical conductors or pathways prior to programming.

Functionality of the IC device 100 may be altered by programming anti-fuse 121 to create fused plates 206. Whereas prior to the programming of anti-fuse 121 electrical paths between external circuit element(s) $145_1$ and active device(s) $139_1$; between external circuit element(s) 143 and active device(s) $139_2$; and between external circuit element(s) 143 and active device(s) $139_2$ are electrically siloed or separated, the fused plates 206 allow for additional or interconnected electrical pathways that may cause the function of IC device 100 to be altered.

For example, as depicted, because of fused plates 206, external circuit element(s) $145_1$ and/or active device(s) $139_1$ are newly electrically connected to external circuit element(s) 143, active device(s) $139_2$, external circuit element(s) $145_2$, and/or active device(s) $139_3$. In one embodiment, these new electrical connections may trigger or drive new or altered IC device 100 functionality and/or restrict or eliminate previous IC device 100 functionality. In another embodiment, these new electrical connections are to redundant circuitry.

FIG. 5 through FIG. 8 depict fabrication stage cross-section elevation views of an the IC device 100 integrated capacitor and anti-fuse structure of FIG. 1, according to exemplary embodiments.

Figure 5:
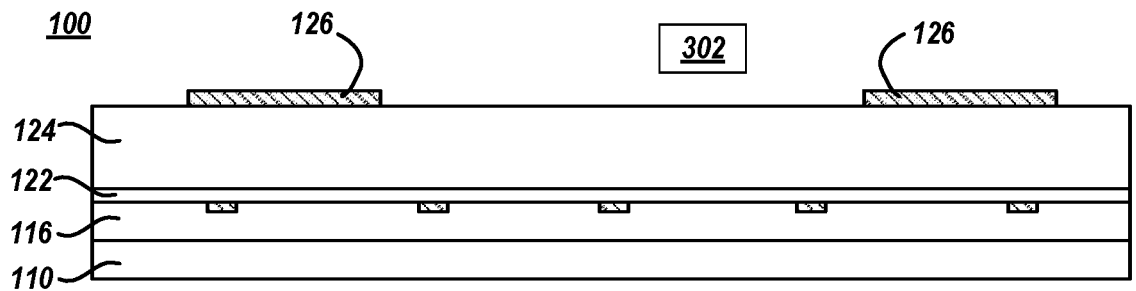
FIG. 5 through FIG. 8 depict fabrication stage cross-section elevation views of an the IC device integrated capacitor and anti-fuse structure of FIG. 1, according to exemplary embodiments.

FIG. 5 is a cross-section elevation of IC device 100 integrated capacitor and anti-fuse structure during a fabrication stage 302, according to an example embodiment. At fabrication stage 302, VIA ILD layer 124 has received a metal layer that has been patterned to form the first capacitor plate(s) 126. Conventional techniques may be used such as depositing conductive material, spinning on a mask, curing the mask to match the pattern of the first capacitor plate(s) 126, and etching the conductive material layer, followed by removing the mask to reveal the first capacitor plate(s) 126, as depicted. Capacitor plate(s) 126 may include one or more VIA pilot holes, as is known in the art.

Figure 6:
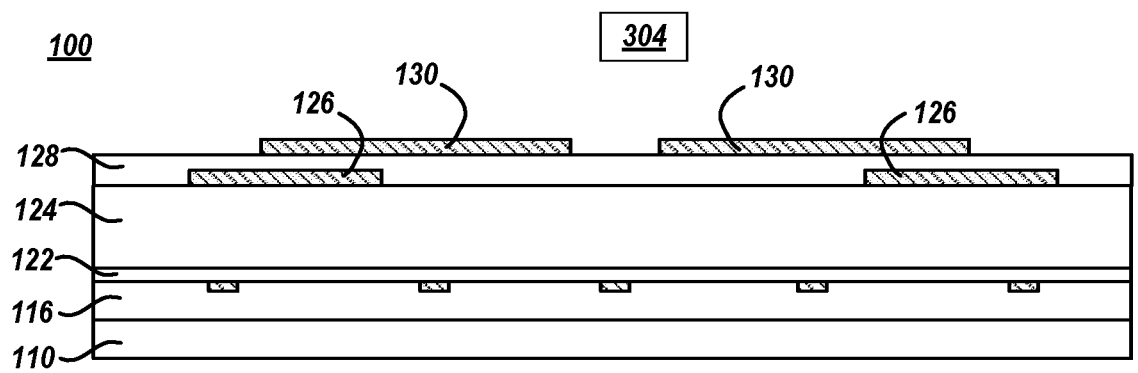

FIG. 6 is a cross-section elevation of IC device 100 integrated capacitor and anti-fuse structure during a fabrication stage 304, according to an example embodiment. At fabrication stage 304, first dielectric layer 128 is formed upon the VIA ILD layer 124 and formed over the first capacitor plate 126. First dielectric layer 128 may entirely cover first capacitor plate 126 as well fully cover exposed portions of the VIA ILD layer 124. Further at fabrication stage 304, capacitor plate(s) 130 are formed. Capacitor plates 130 may be formed by forming a second metal layer conformally over the first dielectric layer 128, such as chemical-vapor depositing the second metal layer. Conventional techniques may be used such as depositing conductive material, spinning on a mask, curing the mask to match the pattern of the second capacitor plate(s) 130, and etching the conductive material, followed by removing the mask to reveal the second capacitor plate(s) 130, as depicted. Capacitor plate(s) 130 may include one or more VIA pilot holes, as is known in the art.

Figure 7:
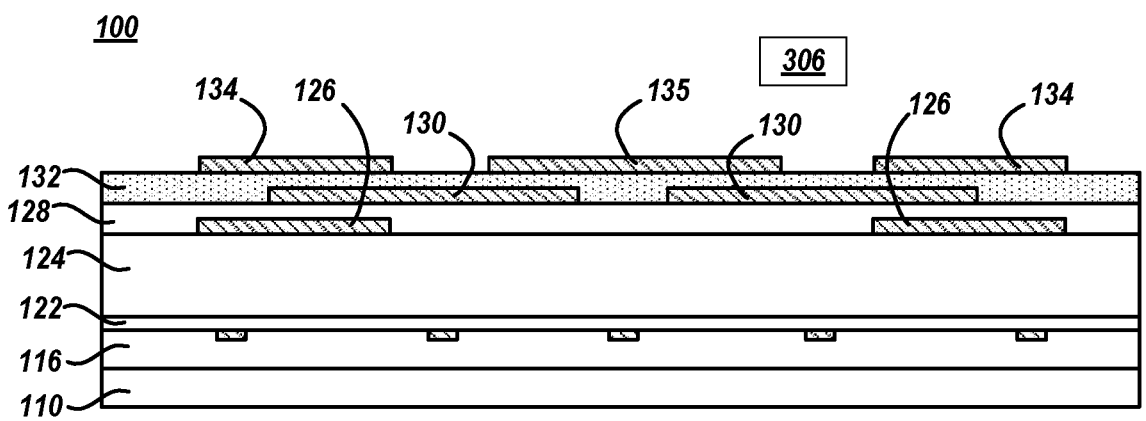

FIG. 7 is a cross-section elevation of IC device 100 integrated capacitor and anti-fuse structure during a fabrication stage 306 according to an example embodiment. At fabrication stage 306, capacitor second dielectric layer 132 is formed upon first dielectric layer 128 and formed over the second capacitor plate(s) 130. Capacitor second dielectric layer 132 may entirely cover second capacitor plate(s) 130 as well as fully cover exposed portions of the first dielectric layer 128. Further at fabrication stage 306, capacitor plate(s) 134 are formed and anti-fuse plate(s) 135 are formed. Capacitor plates 134 and anti-fuse plates 135 may be formed by forming a third metal layer conformally over the second dielectric layer 132, such as physical-vapor depositing the third metal layer. Conventional techniques may be used such as depositing conductive material, spinning on a mask, curing the mask to match the pattern of the third capacitor plate(s) 134 and anti-fuse plate(s) 135, and etching the conductive material, followed by removing the mask to reveal the third capacitor plate(s) 134 and to reveal the anti-fuse plate(s) 135, as depicted. Capacitor plate(s) 134 and anti-fuse plate(s) 135 may include one or more VIA pilot holes, as is known in the art.

Figure 8:
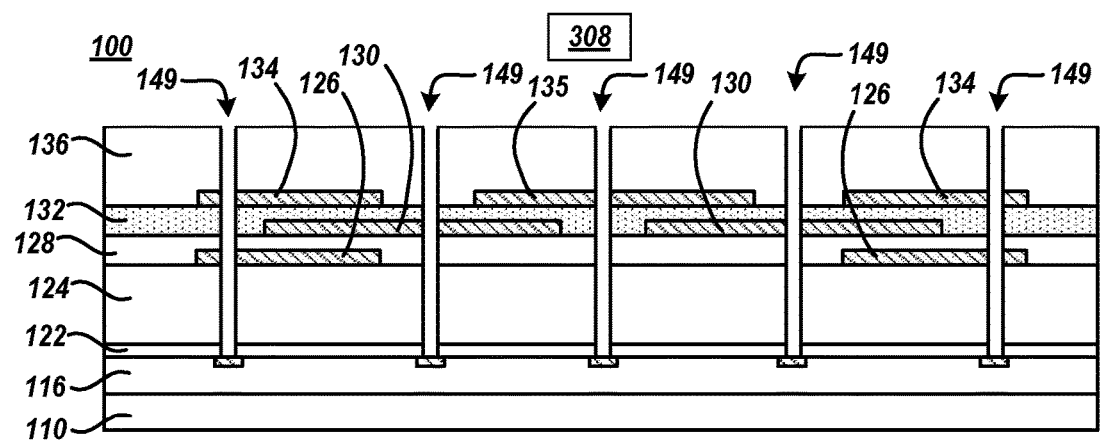

FIG. 8 is a cross-section elevation of IC device 100 integrated capacitor and anti-fuse structure during a fabrication stage 308 according to an example embodiment. At fabrication stage 308, second VIA ILD layer 136 is formed upon second dielectric layer 132 and formed over the third capacitor plate(s) 134 and over the anti-fuse plate(s) 135. Capacitor VIA ILD layer 136 may entirely cover capacitor plate(s) 134 and entirely over the anti-fuse plate(s) 135 as well as fully cover exposed portions of the second dielectric layer 132. Further at stage 308, VIA recesses 149 are formed that penetrate the capacitor 120 and the anti-fuse 121. The VIA recesses 149 each expose a respective upper metallization 118. The VIA recesses 149 may penetrate and extend through the various dielectric layers between the upper surface of layer 136 and the upper metallization 118 and may penetrate and extend through one or more VIAs at the location of a VIA pilot hole therein. Further at stage 308, an adhesion layer may also be formed upon the sidewalls of the VIA recesses 149. Further processing results in embodiments that are illustrated and described for the IC device 100 integrated capacitor and anti-fuse structure depicted in, e.g., FIG. 1 through FIG. 3. For example, VIA recess 149 may be filled with a conductive material, a second BE metallization 190, 191 may be formed upon VIAs 138, 140, 141, respectively, or the like.

Figure 9:
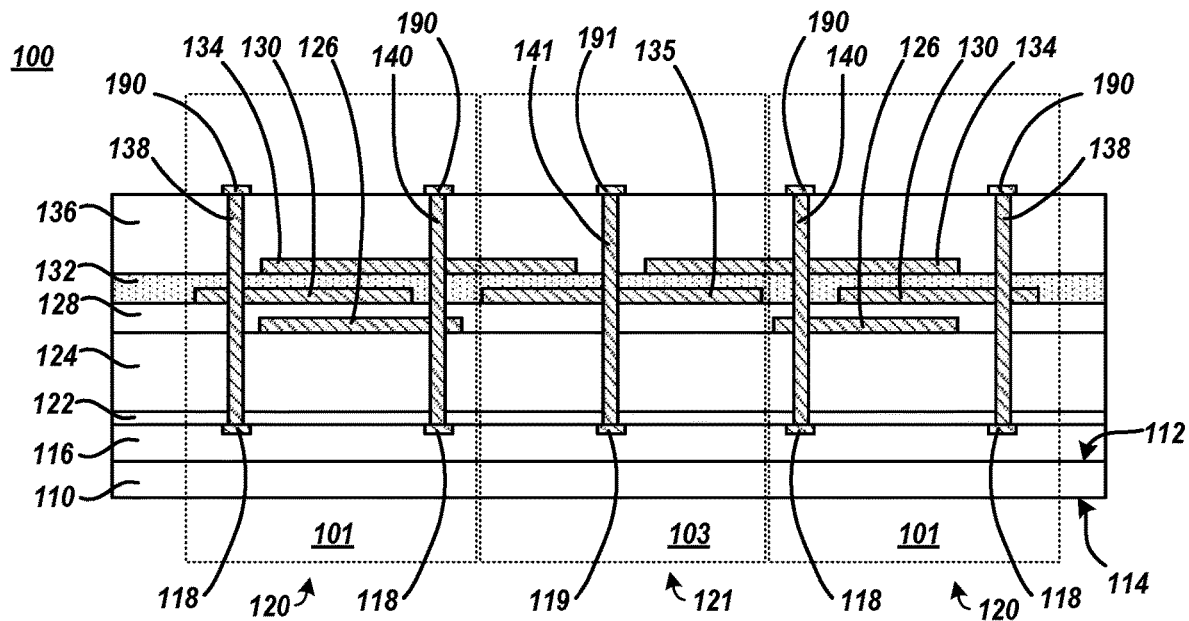
FIG. 9 is a cross-section elevation view of an on IC device integrated capacitor and anti-fuse structure, according to an exemplary embodiment.

FIG. 9 is a cross-section elevation view of an on IC device 100 integrated capacitor and anti-fuse structure, according to an exemplary embodiment. IC device 100 includes a capacitor region 101 and an anti-fuse region 103. In the present embodiment, IC device 100 integrated capacitor and anti-fuse structure includes anti-fuse plate 135 formed along with second capacitor plate 130. For brevity purposes, several structures that are shared by IC device 100 integrated capacitor and anti-fuse structure and were previously described with respected to FIG. 1 are not presently described in order to better designate the embodiment depicted in FIG. 9.

Capacitor plate 126 is formed upon the first VIA ILD 124 within capacitor regions 101. Capacitor first dielectric layer 128 is formed upon the VIA ILD 124 and over the patterned capacitor plate 126 within the capacitor regions 101 and is formed upon the VIA ILD 124 within anti-fuse region 103.

Capacitor plate 130 is formed upon the capacitor first dielectric layer 128 in the capacitor regions 101 and has an effective portion that is substantially parallel-planar with the patterned capacitor plate 126 and anti-fuse plate 135 is formed upon the capacitor first dielectric layer 128 in the anti-fuse regions 103 and has an effective portion(s) that are substantially parallel-planar with the patterned capacitor plate 130. The capacitor plate 130 and the anti-fuse plate 135 may be formed in the same or otherwise shared fabrication stage.

Capacitor second dielectric layer 132 is formed upon the capacitor first dielectric layer 128, over the patterned capacitor plate 130, and over the anti-fuse plate 135. A patterned capacitor plate 134 is formed upon the capacitor second dielectric layer 132 within the capacitor region 101 and has an effective portion that is substantially parallel-planar with the patterned capacitor plate 130. A second VIA ILD layer 136 is formed upon the capacitor second dielectric layer 132 and over the patterned capacitor plate 134.

The capacitor plate 134 is formed upon the capacitor first dielectric layer 128 in the capacitor region 101 and in the anti-fuse region 103. In other words, the capacitor plate 134 is formed within the capacitor region 101 and at least partially extends into the neighboring anti-fuse region 103. As such, the capacitor 120 and anti-fuse 121 share the capacitor plate 134 and the capacitor 120 and anti-fuse 121 are thus deemed integrated, in accordance with various embodiments of the present invention. In the depicted embodiment, capacitor plate 134 and anti-fuse plate 135 may fuse into fused plates 206 upon the programming of anti-fuse 121.

Electrical coupling of the capacitor structure 120 between the semiconductor substrate 110 and the outside world is accomplished by power via 138 and ground via 140. As illustrated in this embodiment, the power via 138 is in contact with both the patterned capacitor plate 130. Grounding is accomplished in this embodiment by direct contact between the ground via 140 and the patterned capacitor plate 134 and the patterned capacitor plate 126.

Electrical coupling of the anti-fuse structure 121 between the semiconductor substrate 110 and the outside world is accomplished by an anti-fuse via 141. As illustrated in this embodiment, the anti-fuse via 141 is in contact with anti-fuse plate 135. VIAs 138, 140, and 141 may be fabricated in the same or a shared fabrication stage.

It may now be appreciated that the power via 138 may be referred to as a first via 138 coupled to the capacitor plate 130. Similarly, but according to this embodiment, the ground via 140 may be referred to as a second via 140 coupled to the capacitor plate 126 and to the capacitor plate 134. It may now be appreciated that the anti-fuse via 141 may be referred to as a third via 141 coupled to the anti-fuse plate 135.

It may now also be appreciated that the respective first and second VIAs 138 and 140 each penetrate and contact two metal layers while connecting between the semiconductor substrate 110 and the outside world. In FIG. 9, the first via 138 penetrates and contacts at a second plate 130 contact point. Also, the second via 140 penetrates and contacts at a first plate 126 contact point and a third plate 134 contact point. Further, the third via 141 penetrates and contacts at a fourth plate 135 contact point.

Figure 10:
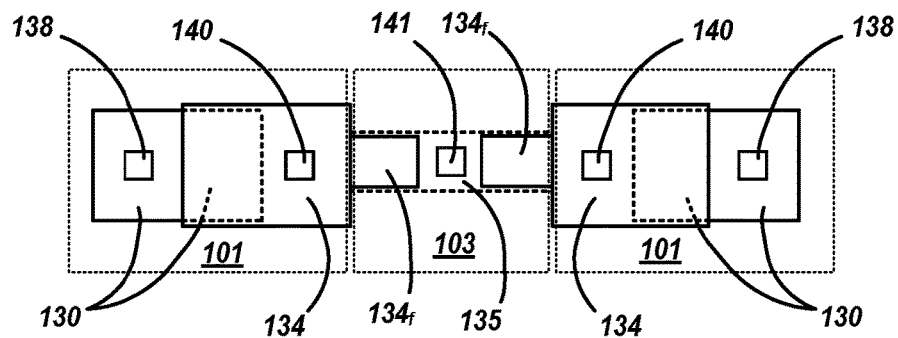
FIG. 10 is a top plan cut-away view of the integrated capacitor and anti-fuse structure depicted in FIG. 9, according to an exemplary embodiment.

FIG. 10 is a top plan cut-away view of the integrated capacitor and anti-fuse structure depicted in FIG. 9, according to an exemplary embodiment. For illustration purposes, several structures are not shown in order to better describe selected structures.

In capacitor region 101, the second plate 130 is shown partially obscured (as phantom lines) by the third plate 134. As depicted, the second plate 130 is contacted by the power via 138, and the third plate 134 is contacted by the ground via 140. The first plate 126 is not depicted in FIG. 10, but it would be disposed below the second plate 130 as seen in FIG. 9.

In anti-fuse region 103, the third plate 134 extends into the anti-fuse structure 121. The region of third plate 134 within anti-fuse structure 121 may be denoted as third plate $134_f$. Anti-fuse plate 135 is shown partially obscured (as phantom lines) by third plate(s) $134_f$. As depicted, the anti-fuse plate 135 is contacted by the anti-fuse via 141, and the third plate $134_f$ is contacted by the ground via 140. As depicted, the front-to-back dimension of third plate $134_f$ may be less than the same front-to-back dimension of third plate 134 within the capacitor structure 120. In other words, the front and rear side surfaces of third plate $134_f$ may be inset from respective front and rear side surfaces of third plate 134 within the capacitor structure 120. The front and rear side surfaces of anti-fuse plate 135 may be substantially coplanar with respective front and rear side surfaces of third plate $134_f$. The relatively smaller top/bottom surface area of third plate $134_f$ relative to the respective top/bottom surface area of third plate 134 within capacitor structure 120 may concentrate electrical charge of anti-fuse plate 135 within the anti-fuse structure 121 and cause the electrical arc/fusing between the anti-fuse plate 135 and third plate $134_f$ upon the programming of anti-fuse structure 121.

FIG. 11 through FIG. 14 depict fabrication stage cross-section elevation views of an the IC device integrated capacitor and anti-fuse structure of FIG. 9, according to exemplary embodiments.

Figure 11:
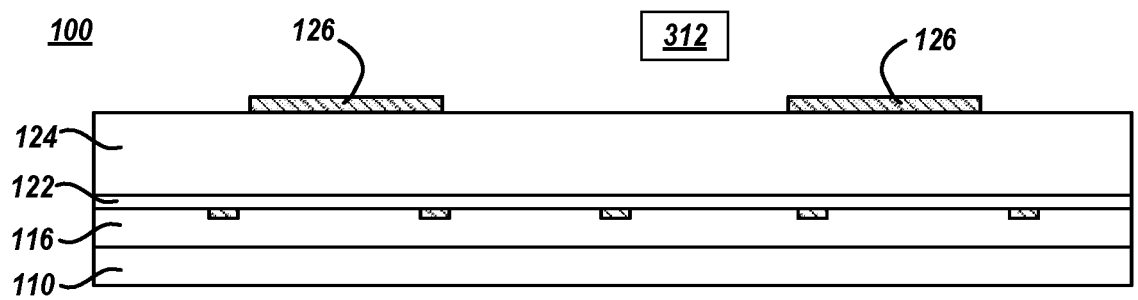
FIG. 11 through FIG. 14 depict fabrication stage cross-section elevation views of an the IC device integrated capacitor and anti-fuse structure of FIG. 9, according to exemplary embodiments.

FIG. 11 is a cross-section elevation of IC device 100 integrated capacitor and anti-fuse structure during a fabrication stage 312, according to an example embodiment. At fabrication stage 312, VIA ILD layer 124 has received a metal layer that has been patterned to form the first capacitor plate(s) 126. Conventional techniques may be used such as depositing conductive material, spinning on a mask, curing the mask to match the pattern of the first capacitor plate(s) 126, and etching the conductive material, followed by removing the mask to reveal the first capacitor plate(s) 126, as depicted.

Figure 12:
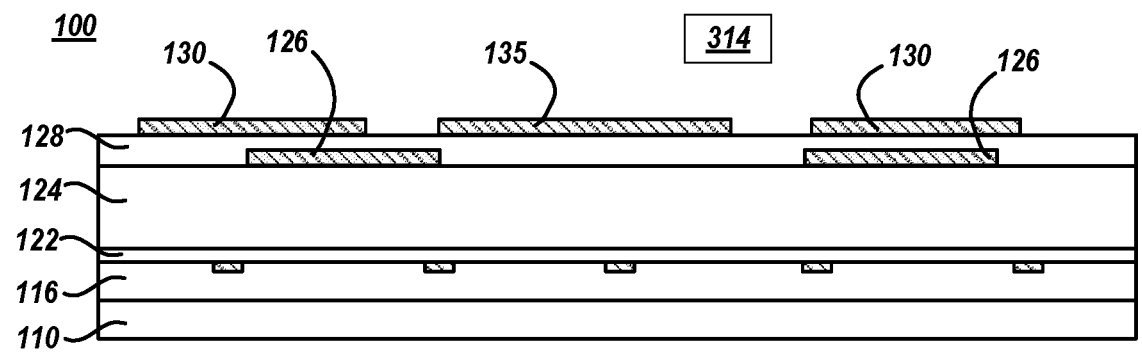

FIG. 12 is a cross-section elevation of IC device 100 integrated capacitor and anti-fuse structure during a fabrication stage 314, according to an example embodiment. At fabrication stage 314, first dielectric layer 128 is formed upon the VIA ILD layer 124 and formed over the first capacitor plate 126. First dielectric layer 128 may entirely cover first capacitor plate 126 as well fully cover exposed portions of the VIA ILD layer 124. Further at fabrication stage 314, capacitor plate(s) 130 and anti-fuse plate(s) 135 are formed. Capacitor plates 130 and anti-fuse plates 135 may be formed by forming a second metal layer conformally over the first dielectric layer 128, such as chemical-vapor depositing the second metal layer. Conventional techniques may be used such as depositing conductive material, spinning on a mask, curing the mask to match the pattern of the second capacitor plate(s) 130 and of the anti-fuse plate(s) 135, and etching the conductive material, followed by removing the mask to reveal the second capacitor plate(s) 130 and the anti-fuse plate(s) 135, as depicted.

Figure 13:
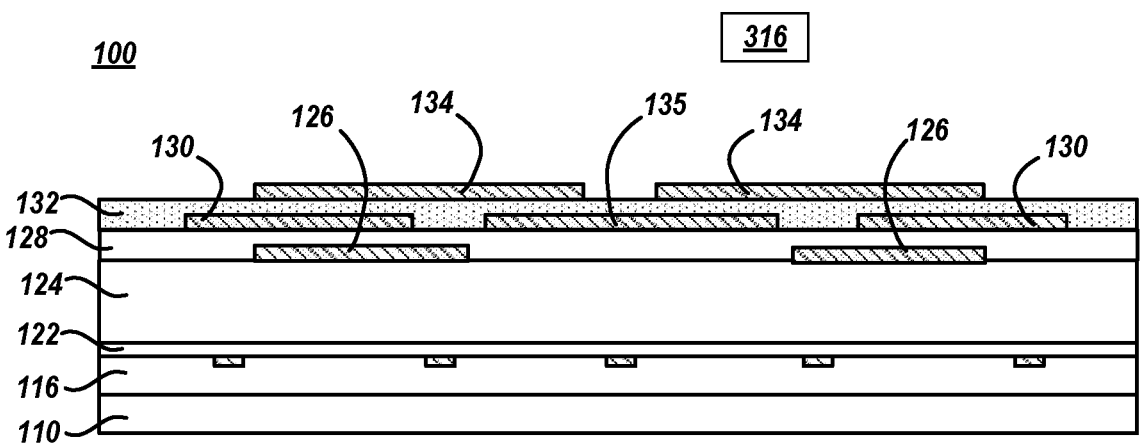

FIG. 13 is a cross-section elevation of IC device 100 integrated capacitor and anti-fuse structure during a fabrication stage 316 according to an example embodiment. At fabrication stage 316, capacitor second dielectric layer 132 is formed upon first dielectric layer 128 and formed over the second capacitor plate(s) 130 and formed over the anti-fuse plate(s) 135. Capacitor second dielectric layer 132 may entirely cover second capacitor plate(s) 130, entirely cover anti-fuse plate(s) 135, as well as fully cover exposed portions of the first dielectric layer 128. Further at fabrication stage 316, capacitor plate(s) 134 are formed. Capacitor plates 134 may be formed by forming a third metal layer conformally over the second dielectric layer 132, such as physical-vapor depositing the third metal layer. Conventional techniques may be used such as depositing conductive material, spinning on a mask, curing the mask to match the pattern of the third capacitor plate(s) 134, and etching the conductive material, followed by removing the mask to reveal the third capacitor plate(s) 134, as depicted.

Figure 14:
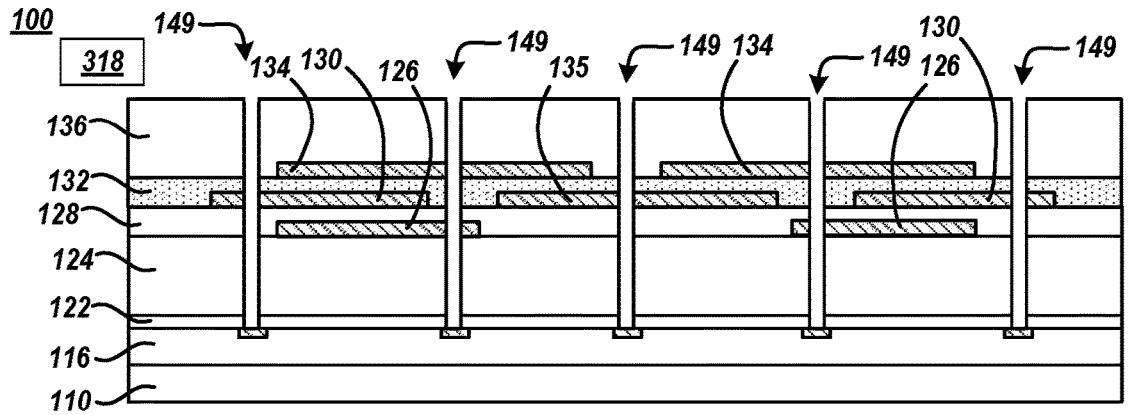

FIG. 14 is a cross-section elevation of IC device 100 integrated capacitor and anti-fuse structure during a fabrication stage 318 according to an example embodiment. At fabrication stage 318, second VIA ILD layer 136 is formed upon second dielectric layer 132 and formed over the third capacitor plate(s) 134. Capacitor VIA ILD layer 136 may entirely cover capacitor plate(s) 134 as well as fully cover exposed portions of the second dielectric layer 132. Further at stage 318, VIA recesses 149 are formed that penetrate the capacitor 120 and the anti-fuse 121. The VIA recesses 149 each expose a respective upper metallization 118. The VIA recesses 149 may penetrate and extend through the various dielectric layers between the upper surface of layer 136 and the upper metallization 118 and may penetrate and extend through one or more VIAs at the location of a VIA pilot hole therein. Further at stage 318, an adhesion layer may also be formed upon the sidewalls of the VIA recesses 149. Further processing results in embodiments that are illustrated and described for the IC device 100 integrated capacitor and anti-fuse structure depicted in, e.g., FIG. 3, FIG. 9, FIG. 10, etc. For example, VIA recess 149 may be filled with a conductive material, a second BE metallization 190, 191 may be formed upon VIAs 138, 140, 141, respectively, or the like.

Figure 15:
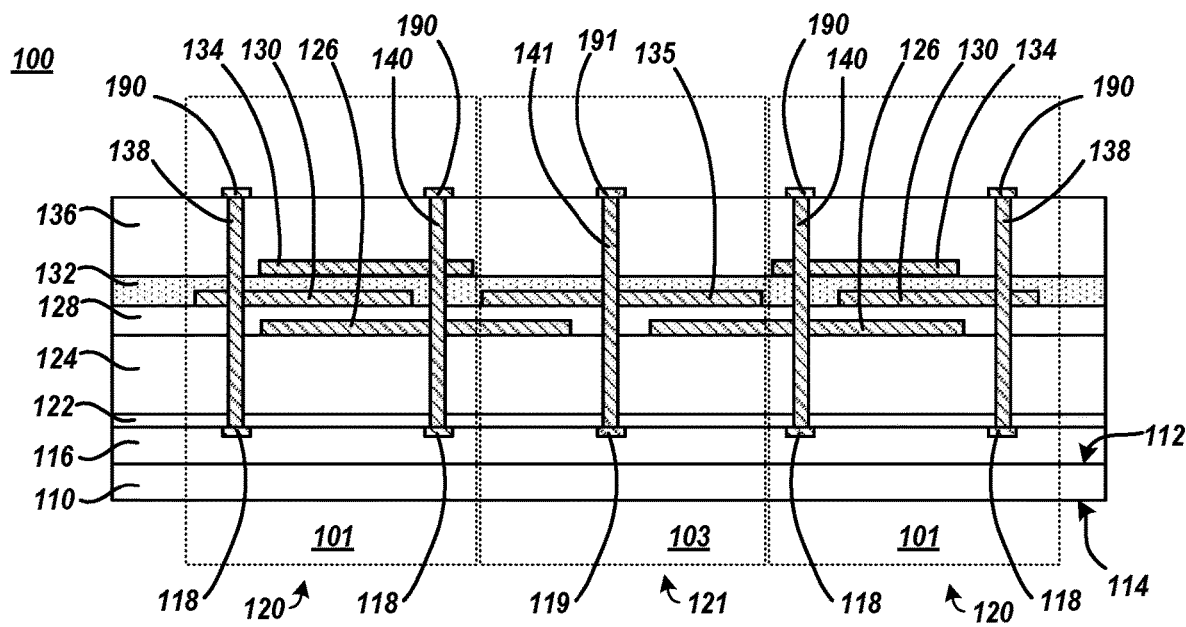
FIG. 15 is a cross-section elevation view of an on IC device integrated capacitor and anti-fuse structure, according to an exemplary embodiment.

FIG. 15 is a cross-section elevation view of an on IC device 100 integrated capacitor and anti-fuse structure, according to an exemplary embodiment. IC device 100 includes a capacitor region 101 and an anti-fuse region 103. In the present embodiment, IC device 100 integrated capacitor and anti-fuse structure includes anti-fuse plate 135 formed along with second capacitor plate 130. For brevity purposes, several structures that are shared by IC device 100 integrated capacitor and anti-fuse structure and were previously described with respected to FIG. 1 are not presently described in order to better designate the embodiment depicted in FIG. 15.

Capacitor plate 126 is formed upon the first VIA ILD 124 within capacitor regions 101 and within anti-fuse region 103. Capacitor first dielectric layer 128 is formed upon the VIA ILD 124 and over the patterned capacitor plate(s) 126. In other words, the capacitor plate 126 is formed within the capacitor region 101 and at least partially extends into the neighboring anti-fuse region 103. As such, the capacitor 120 and anti-fuse 121 share the capacitor plate 126 and the capacitor 120 and anti-fuse 121 are thus deemed integrated, in accordance with various embodiments of the present invention. In the depicted embodiment, capacitor plate 126 and anti-fuse plate 135 may fuse into fused plates 206 upon the programming of anti-fuse 121.

Capacitor plate 130 is formed upon the capacitor first dielectric layer 128 in the capacitor regions 101 and has an effective portion that is substantially parallel-planar with the patterned capacitor plate 126 and anti-fuse plate 135 is formed upon the capacitor first dielectric layer 128 in the anti-fuse regions 103 and has an effective portion(s) that are substantially parallel-planar with the patterned capacitor plate 130. The capacitor plate 130 and the anti-fuse plate 135 may be formed in the same or otherwise shared fabrication stage.

Capacitor second dielectric layer 132 is formed upon the capacitor first dielectric layer 128, over the patterned capacitor plate 130, and over the anti-fuse plate 135. A patterned capacitor plate 134 is formed upon the capacitor second dielectric layer 132 within the capacitor region 101 and has an effective portion that is substantially parallel-planar with the patterned capacitor plate 130. A second VIA ILD layer 136 is formed upon the capacitor second dielectric layer 132 and over the patterned capacitor plate 134.

Electrical coupling of the capacitor structure 120 between the semiconductor substrate 110 and the outside world is accomplished by power via 138 and ground via 140. As illustrated in this embodiment, the power via 138 is in contact with both the patterned capacitor plate 130. Grounding is accomplished in this embodiment by direct contact between the ground via 140 and the patterned capacitor plate 134 and the patterned capacitor plate 126.

Electrical coupling of the anti-fuse structure 121 between the semiconductor substrate 110 and the outside world is accomplished by anti-fuse via 141. As illustrated in this embodiment, the anti-fuse via 141 is in contact with anti-fuse plate 135. VIAs 138, 140, and 141 may be fabricated in the same or a shared fabrication stage.

It may now be appreciated that the power via 138 may be referred to as a first via 138 coupled to the capacitor plate 130. Similarly, but according to this embodiment, the ground via 140 may be referred to as a second via 140 coupled to the capacitor plate 126 and to the capacitor plate 134. It may now be appreciated that the anti-fuse via 141 may be referred to as a third via 141 coupled to the anti-fuse plate 135.

It may now also be appreciated that the respective first and second VIAs 138 and 140 each penetrate and contact two metal layers while connecting between the semiconductor substrate 110 and the outside world. In FIG. 15, the first via 138 penetrates and contacts at a second plate 130 contact point. Also, the second via 140 penetrates and contacts at a first plate 126 contact point and a third plate 134 contact point. Further, the third via 141 penetrates and contacts at a fourth plate 135 contact point.

Figure 16:
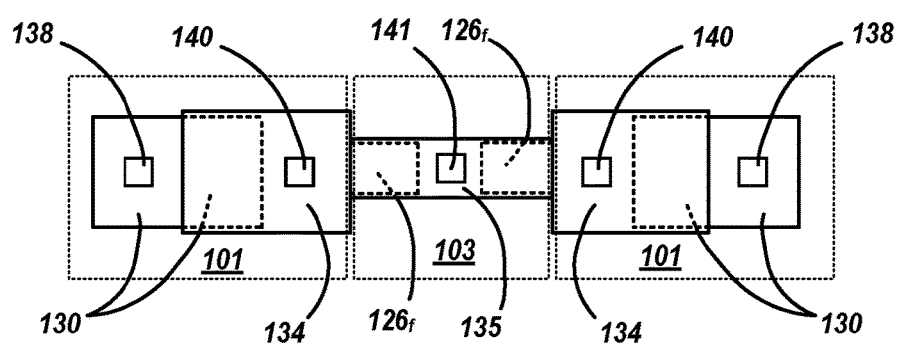
FIG. 16 is a top plan cut-away view of the integrated capacitor and anti-fuse structure depicted in FIG. 15, according to an exemplary embodiment.

FIG. 16 is a top plan cut-away view of the integrated capacitor and anti-fuse structure depicted in FIG. 15, according to an exemplary embodiment. For illustration purposes, several structures are not shown in order to better describe selected structures.

In capacitor region 101, the second plate 130 is shown partially obscured (as phantom lines) by the third plate 134. As depicted, the second plate 130 is contacted by the power via 138, and the third plate 134 is contacted by the ground via 140. The first plate 126 is disposed below the second plate 130.

In anti-fuse region 103, the first plate 126 extends into the anti-fuse structure 121. The region of first plate 126 within anti-fuse structure 121 may be denoted as first plate 126$_f$. First plate(s) 126$_f$ are shown partially obscured (as phantom lines) by anti-fuse plate 135. As depicted, the anti-fuse plate 135 is contacted by the anti-fuse via 141, and the first plate 126$_f$ is contacted by the ground via 140. As depicted, the front-to-back dimension of first plate 126$_f$ may be less than the same front-to-back dimension of first plate 126 within the capacitor structure 120. In other words, the front and rear side surfaces of first plate 126$_f$ may be inset from respective front and rear side surfaces of first plate 126 within the capacitor structure 120. The front and rear side surfaces of anti-fuse plate 135 may be substantially coplanar with respective front and rear side surfaces of first plate 126$_f$. The relatively smaller top/bottom surface area of first plate 126$_f$ relative to the respective top/bottom surface area of first plate 126 within capacitor structure 120 may concentrate electrical charge of anti-fuse plate 135 within the anti-fuse structure 121 and cause the electrical arc/fusing between the anti-fuse plate 135 and first plate 126$_f$, upon the programming of anti-fuse structure 121.

FIG. 17 through FIG. 20 depict fabrication stage cross-section elevation views of an the IC device integrated capacitor and anti-fuse structure of FIG. 15, according to exemplary embodiments.

Figure 17:
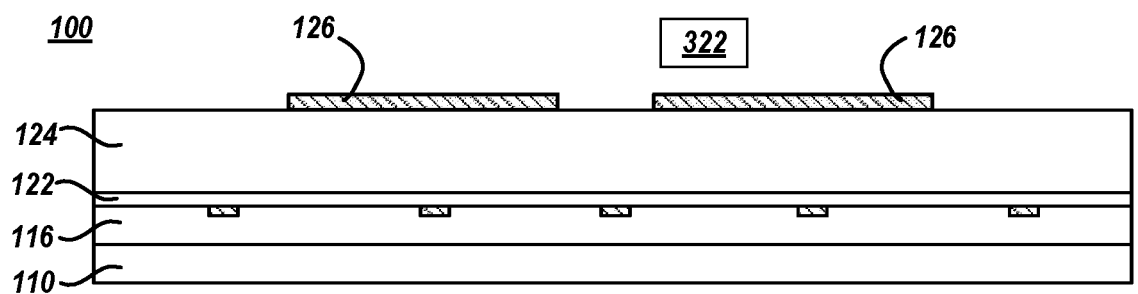
FIG. 17 through FIG. 20 depict fabrication stage cross-section elevation views of an the IC device integrated capacitor and anti-fuse structure of FIG. 15, according to exemplary embodiments.

FIG. 17 is a cross-section elevation of IC device 100 integrated capacitor and anti-fuse structure during a fabrication stage 322, according to an example embodiment. At fabrication stage 322, VIA ILD layer 124 has received a metal layer that has been patterned to form the first capacitor plate(s) 126. Conventional techniques may be used such as depositing conductive material, spinning on a mask, curing the mask to match the pattern of the first capacitor plate(s)

126, and etching the conductive material, followed by removing the mask to reveal the first capacitor plate(s) 126, as depicted.

Figure 18:
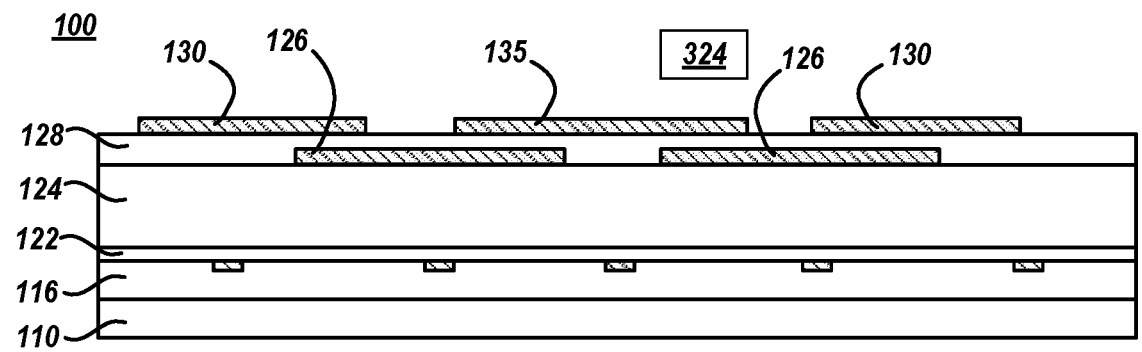

FIG. 18 is a cross-section elevation of IC device 100 integrated capacitor and anti-fuse structure during a fabrication stage 324, according to an example embodiment. At fabrication stage 324, first dielectric layer 128 is formed upon the VIA ILD layer 124 and formed over the first capacitor plate(s) 126. First dielectric layer 128 may entirely cover first capacitor plate(s) 126 as well fully cover exposed portions of the VIA ILD layer 124. Further at fabrication stage 324, capacitor plate(s) 130 and anti-fuse plate(s) 135 are formed. Capacitor plates 130 and anti-fuse plates 135 may be formed by forming a second metal layer conformally over the first dielectric layer 128, such as chemical-vapor depositing the second metal layer. Conventional techniques may be used such as depositing conductive material, spinning on a mask, curing the mask to match the pattern of the second capacitor plate(s) 130 and of the anti-fuse plate(s) 135, and etching the conductive material, followed by removing the mask to reveal the second capacitor plate(s) 130 and the anti-fuse plate(s) 135, as depicted.

Figure 19:
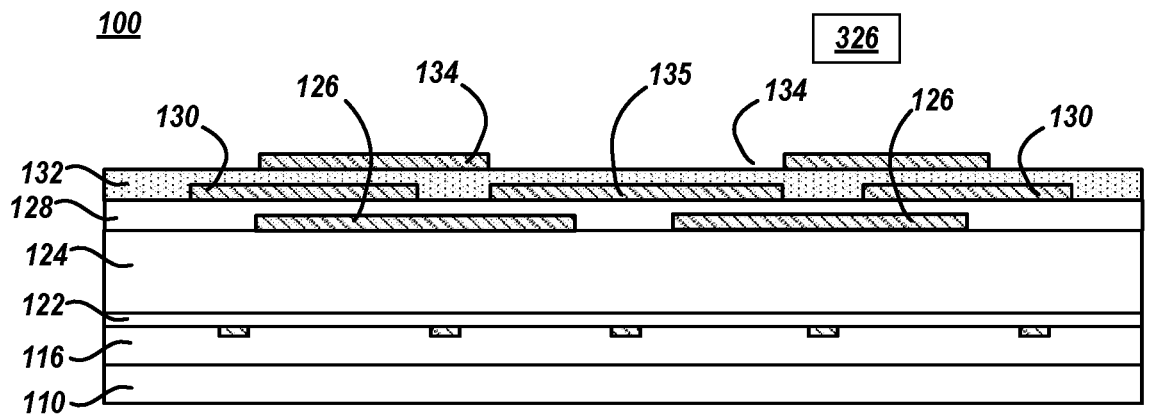

FIG. 19 is a cross-section elevation of IC device 100 integrated capacitor and anti-fuse structure during a fabrication stage 326 according to an example embodiment. At fabrication stage 326, capacitor second dielectric layer 132 is formed upon first dielectric layer 128 and formed over the second capacitor plate(s) 130 and formed over the anti-fuse plate(s) 135. Capacitor second dielectric layer 132 may entirely cover second capacitor plate(s) 130, entirely cover anti-fuse plate(s) 135, as well as fully cover exposed portions of the first dielectric layer 128. Further at fabrication stage 326, capacitor plate(s) 134 are formed. Capacitor plates 134 may be formed by forming a third metal layer conformally over the second dielectric layer 132, such as physical-vapor depositing the third metal layer. Conventional techniques may be used such as depositing conductive material, spinning on a mask, curing the mask to match the pattern of the third capacitor plate(s) 134, and etching the conductive material, followed by removing the mask to reveal the third capacitor plate(s) 134, as depicted.

Figure 20:
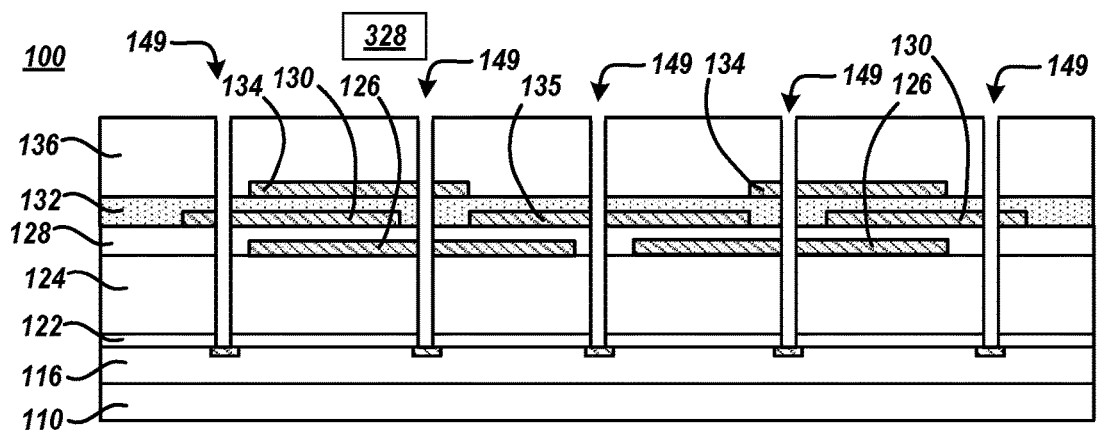

FIG. 20 is a cross-section elevation of IC device 100 integrated capacitor and anti-fuse structure during a fabrication stage 328 according to an example embodiment. At fabrication stage 328, second VIA ILD layer 136 is formed upon second dielectric layer 132 and formed over the third capacitor plate(s) 134. Capacitor VIA ILD layer 136 may entirely cover capacitor plate(s) 134 as well as fully cover exposed portions of the second dielectric layer 132. Further at stage 328, VIA recesses 149 are formed that penetrate the capacitor 120 and the anti-fuse 121. The VIA recesses 149 each expose a respective upper metallization 118. The VIA recesses 149 may penetrate and extend through the various dielectric layers between the upper surface of layer 136 and the upper metallization 118 and may penetrate and extend through one or more VIAs at the location of a VIA pilot hole therein. Further at stage 328, an adhesion layer may also be formed upon the sidewalls of the VIA recesses 149. Further processing results in embodiments that are illustrated and described for the IC device 100 integrated capacitor and anti-fuse structure depicted in, e.g., FIG. 3, FIG. 15, FIG. 16, etc. For example, VIA recess 149 may be filled with a conductive material, a second BE metallization 190, 191 may be formed upon VIAs 138, 140, 141, respectively, or the like.

Figure 21:
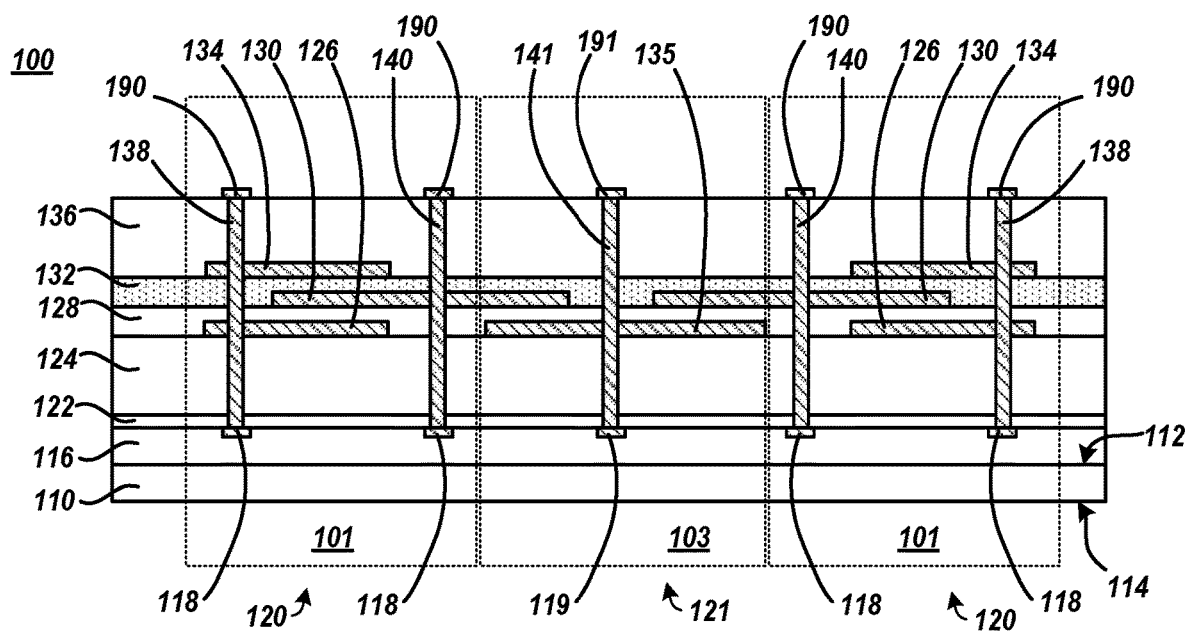
FIG. 21 is a cross-section elevation view of an on IC device integrated capacitor and anti-fuse structure, according to an exemplary embodiment.

FIG. 21 is a cross-section elevation view of an on IC device 100 integrated capacitor and anti-fuse structure, according to an exemplary embodiment. IC device 100 includes a capacitor region 101 and an anti-fuse region 103. In the present embodiment, IC device 100 integrated capacitor and anti-fuse structure includes anti-fuse plate 135 formed along with first capacitor plate 126. For brevity purposes, several structures that are shared by IC device 100 integrated capacitor and anti-fuse structure and were previously described with respected to FIG. 1 are not presently described in order to better designate the embodiment depicted in FIG. 21.

Capacitor plate 126 is formed upon the first VIA ILD 124 within capacitor regions 101 and anti-fuse plate is formed upon the first VIA ILD 124 within anti-fuse region 103. Anti-fuse plate 135 has an effective portion(s) that are substantially parallel-planar with the patterned capacitor plate 126. The capacitor plate 126 and the anti-fuse plate 135 may be formed in the same or otherwise shared fabrication stage.

Capacitor first dielectric layer 128 is formed upon the VIA ILD 124 and over the patterned capacitor plate(s) 126 and over the patterned anti-fuse plate 135. Capacitor plate 130 is formed upon first dielectric layer 128 within the capacitor region 101 and at least partially extends into the neighboring anti-fuse region 103. As such, the capacitor 120 and anti-fuse 121 share the capacitor plate 130. The capacitor 120 and anti-fuse 121 are thus deemed integrated, in accordance with various embodiments of the present invention. In the depicted embodiment, capacitor plate 130 and anti-fuse plate 135 may fuse into fused plates 206 upon the programming of anti-fuse 121.

Capacitor second dielectric layer 132 is formed upon the capacitor first dielectric layer 128 and over the patterned capacitor plate 130. A patterned capacitor plate 134 is formed upon the capacitor second dielectric layer 132 within the capacitor region 101 and has an effective portion that is substantially parallel-planar with the patterned capacitor plate 130. A second VIA ILD layer 136 is formed upon the capacitor second dielectric layer 132 and over the patterned capacitor plate 134.

Electrical coupling of the capacitor structure 120 between the semiconductor substrate 110 and the outside world is accomplished by power via 138 and ground via 140. As illustrated in this embodiment, the power via 138 is in contact with both the first capacitor plate 126 and third capacitor plate 134. Grounding is accomplished in this embodiment by direct contact between the ground via 140 and the second capacitor plate 130.

Electrical coupling of the anti-fuse structure 121 between the semiconductor substrate 110 and the outside world is accomplished by anti-fuse via 141. As illustrated in this embodiment, the anti-fuse via 141 is in contact with anti-fuse plate 135. VIAs 138, 140, and 141 may be fabricated in the same or a shared fabrication stage.

It may now be appreciated that the power via 138 may be referred to as a first via 138 coupled to the capacitor plate 126 and capacitor plate 134. Similarly, but according to this embodiment, the ground via 140 may be referred to as a second via 140 coupled to the capacitor plate 130. It may now be appreciated that the anti-fuse via 141 may be referred to as a third via 141 coupled to the anti-fuse plate 135.

It may now also be appreciated that the respective first and second VIAs 138 and 140 each penetrate and contact two metal layers while connecting between the semiconductor substrate 110 and the outside world. In FIG. 21, the first via 138 penetrates and contacts at a first plate 126 contact point and penetrates and contacts at a third plate 134 contact point.

Also, the second via 140 penetrates and contacts at a second plate 130 contact point. Further, the third via 141 penetrates and contacts at a fourth plate 135 contact point.

Figure 22:
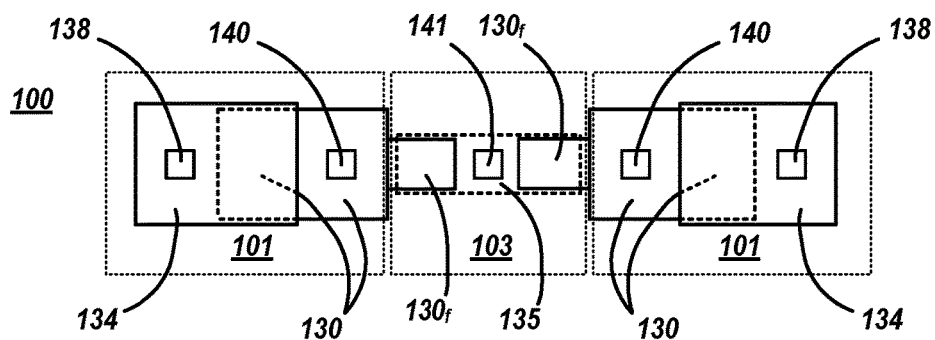
FIG. 22 is a top plan cut-away view of the integrated capacitor and anti-fuse structure depicted in FIG. 21, according to an exemplary embodiment.

FIG. 22 is a top plan cut-away view of the integrated capacitor and anti-fuse structure depicted in FIG. 21, according to an exemplary embodiment. For illustration purposes, several structures are not shown in order to better describe selected structures.

In capacitor region 101, the second plate 130 is shown partially obscured (as phantom lines) by the third plate 134. As depicted, the third plate 134 is contacted by the power via 138, and the second plate 130 is contacted by the ground via 140. The first plate 126 is disposed below the second plate 130 and is not shown in FIG. 22.

In anti-fuse region 103, the second plate 130 extends into the anti-fuse structure 121. The region of second plate 130 within anti-fuse structure 121 may be denoted as second plate 130$_f$. Anti-fuse plate 135 is shown partially obscured (as phantom lines) by second plate(s) 130$_f$. As depicted, the anti-fuse plate 135 is contacted by the anti-fuse via 141, and the second plate 130$_f$ is contacted by the ground via 140. As depicted, the front-to-back dimension of second plate 130$_f$ may be less than the same front-to-back dimension of second plate 130 within the capacitor structure 120. In other words, the front and rear side surfaces of second plate 130$_f$ may be inset from respective front and rear side surfaces of second plate 130 within the capacitor structure 120. The front and rear side surfaces of anti-fuse plate 135 may be substantially coplanar with respective front and rear side surfaces of second plate 130$_f$. The relatively smaller top/bottom surface area of second plate 130$_f$ relative to the respective top/bottom surface area of second plate 130 within capacitor structure 120 may concentrate electrical charge of anti-fuse plate 135 within the anti-fuse structure 121 and cause the electrical arc/fusing between the anti-fuse plate 135 and second plate 130$_f$ upon the programming of anti-fuse structure 121.

FIG. 23 through FIG. 26 depict fabrication stage cross-section elevation views of an the IC device integrated capacitor and anti-fuse structure of FIG. 21, according to exemplary embodiments.

Figure 23:
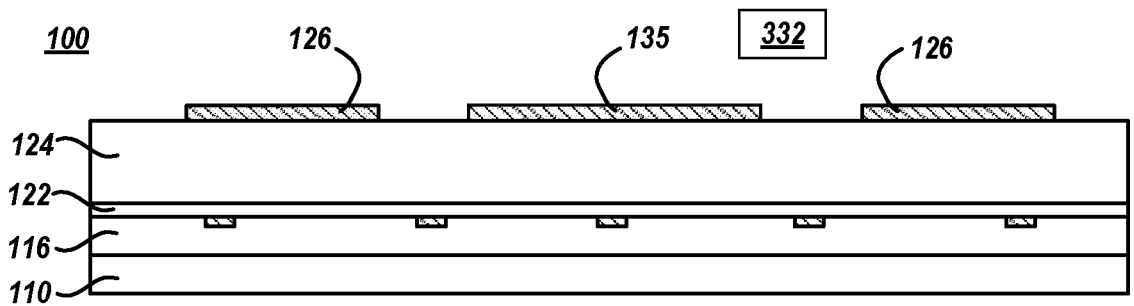
FIG. 23 through FIG. 26 depict fabrication stage cross-section elevation views of an the IC device integrated capacitor and anti-fuse structure of FIG. 21, according to exemplary embodiments.

FIG. 23 is a cross-section elevation of IC device 100 integrated capacitor and anti-fuse structure during a fabrication stage 332, according to an example embodiment. At fabrication stage 332, VIA ILD layer 124 has received a metal layer that has been patterned to form the first capacitor plate(s) 126 and to form the anti-fuse plate(s) 135. Conventional techniques may be used such as depositing conductive material, spinning on a mask, curing the mask to match the pattern of the first capacitor plate(s) 126 and the anti-fuse plate(s) 135, and etching the conductive material, followed by removing the mask to reveal the first capacitor plate(s) 126 and the anti-fuse plate(s) 135, as depicted.

Figure 24:
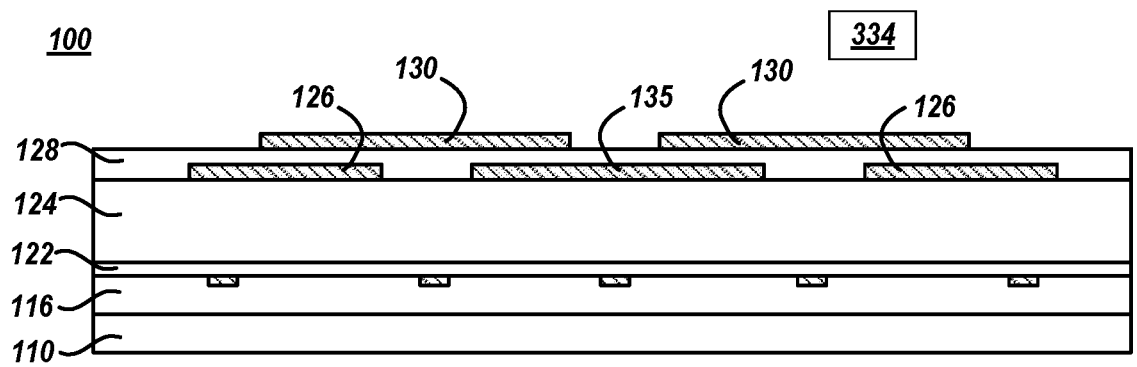

FIG. 24 is a cross-section elevation of IC device 100 integrated capacitor and anti-fuse structure during a fabrication stage 334, according to an example embodiment. At fabrication stage 334, first dielectric layer 128 is formed upon the VIA ILD layer 124, formed over the first capacitor plate(s) 126, and formed over the anti-fuse plate(s) 135. First dielectric layer 128 may entirely cover first capacitor plate(s) 126, entirely cover the anti-fuse plate(s) 135, as well fully cover exposed portions of the VIA ILD layer 124. Further at fabrication stage 334, capacitor plate(s) 130 are formed. Capacitor plates 130 may be formed by forming a second metal layer conformally over the first dielectric layer 128, such as chemical-vapor depositing the second metal layer. Conventional techniques may be used such as depositing conductive material, spinning on a mask, curing the mask to match the pattern of the second capacitor plate(s) 130, and etching the conductive material, followed by removing the mask to reveal the second capacitor plate(s) 130, as depicted.

Figure 25:
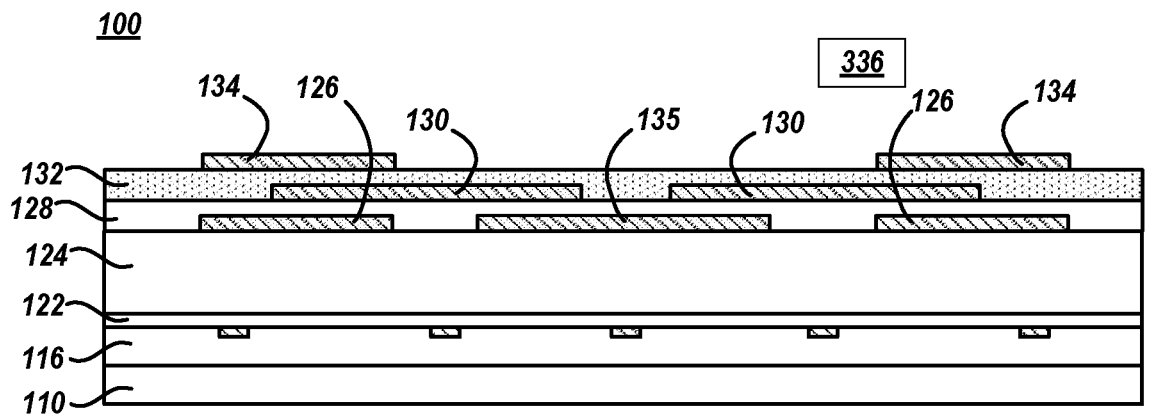

FIG. 25 is a cross-section elevation of IC device 100 integrated capacitor and anti-fuse structure during a fabrication stage 336 according to an example embodiment. At fabrication stage 336, capacitor second dielectric layer 132 is formed upon first dielectric layer 128 and formed over the second capacitor plate(s) 130. Capacitor second dielectric layer 132 may entirely cover second capacitor plate(s) 130 as well as fully cover exposed portions of the first dielectric layer 128. Further at fabrication stage 336, capacitor plate(s) 134 are formed. Capacitor plates 134 may be formed by forming a third metal layer conformally over the second dielectric layer 132, such as physical-vapor depositing the third metal layer. Conventional techniques may be used such as depositing conductive material, spinning on a mask, curing the mask to match the pattern of the third capacitor plate(s) 134, and etching the conductive material, followed by removing the mask to reveal the third capacitor plate(s) 134, as depicted.

Figure 26:
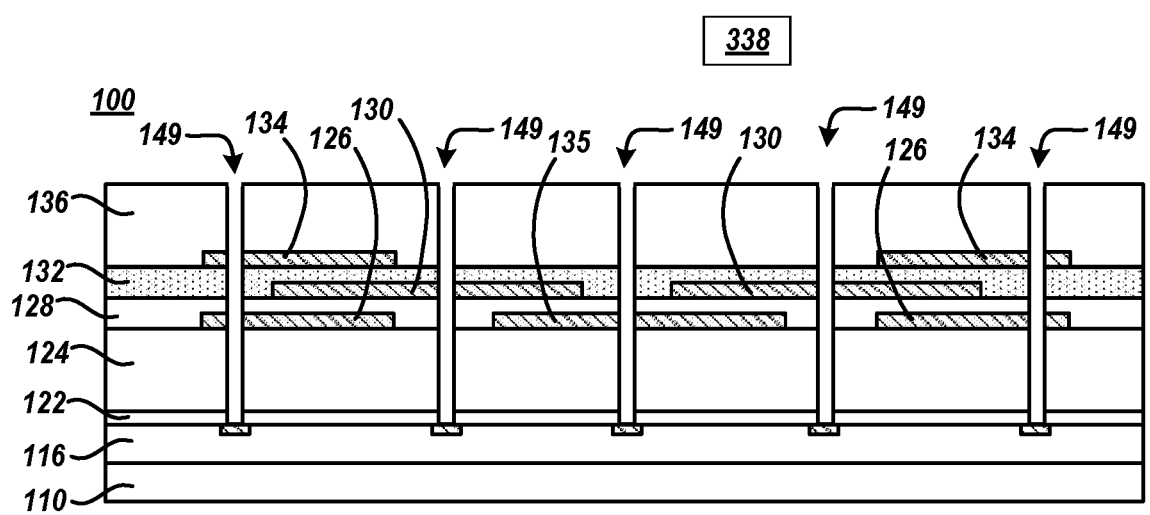

FIG. 26 is a cross-section elevation of IC device 100 integrated capacitor and anti-fuse structure during a fabrication stage 338 according to an example embodiment. At fabrication stage 338, second VIA ILD layer 136 is formed upon second dielectric layer 132 and formed over the third capacitor plate(s) 134. Capacitor VIA ILD layer 136 may entirely cover capacitor plate(s) 134 as well as fully cover exposed portions of the second dielectric layer 132. Further at stage 338, VIA recesses 149 are formed that penetrate the capacitor 120 and the anti-fuse 121. The VIA recesses 149 each expose a respective upper metallization 118. The VIA recesses 149 may penetrate and extend through the various dielectric layers between the upper surface of layer 136 and the upper metallization 118 and may penetrate and extend through one or more VIAs at the location of a VIA pilot hole therein. Further at stage 338, an adhesion layer may also be formed upon the sidewalls of the VIA recesses 149. Further processing results in embodiments that are illustrated and described for the IC device 100 integrated capacitor and anti-fuse structure depicted in, e.g., FIG. 3, FIG. 21, FIG. 22, etc. For example, VIA recess 149 may be filled with a conductive material, a second BE metallization 190, 191 may be formed upon VIAs 138, 140, 141, respectively, or the like.

It may be now appreciated that capacitor 120 may include at least two metal layers separated by a dielectric material. A first capacitor metal layer may have a portion within the capacitor 120 and may have a portion that extends into the anti-fuse 121. A second capacitor metal layer may have coplanar top and bottom surfaces relative to the anti-fuse plate within the anti-fuse 121 as the second capacitor metal layer and the anti-fuse plate may be fabricated, patterned, or the like, from the same metal layer in the same fabrication stage. In other words, such layers may be in the same level.

Further it may be appreciated that ground VIA 140 may not be at ground potential but may rather be at another non ground reference potential as is known the art.

Figure 27:
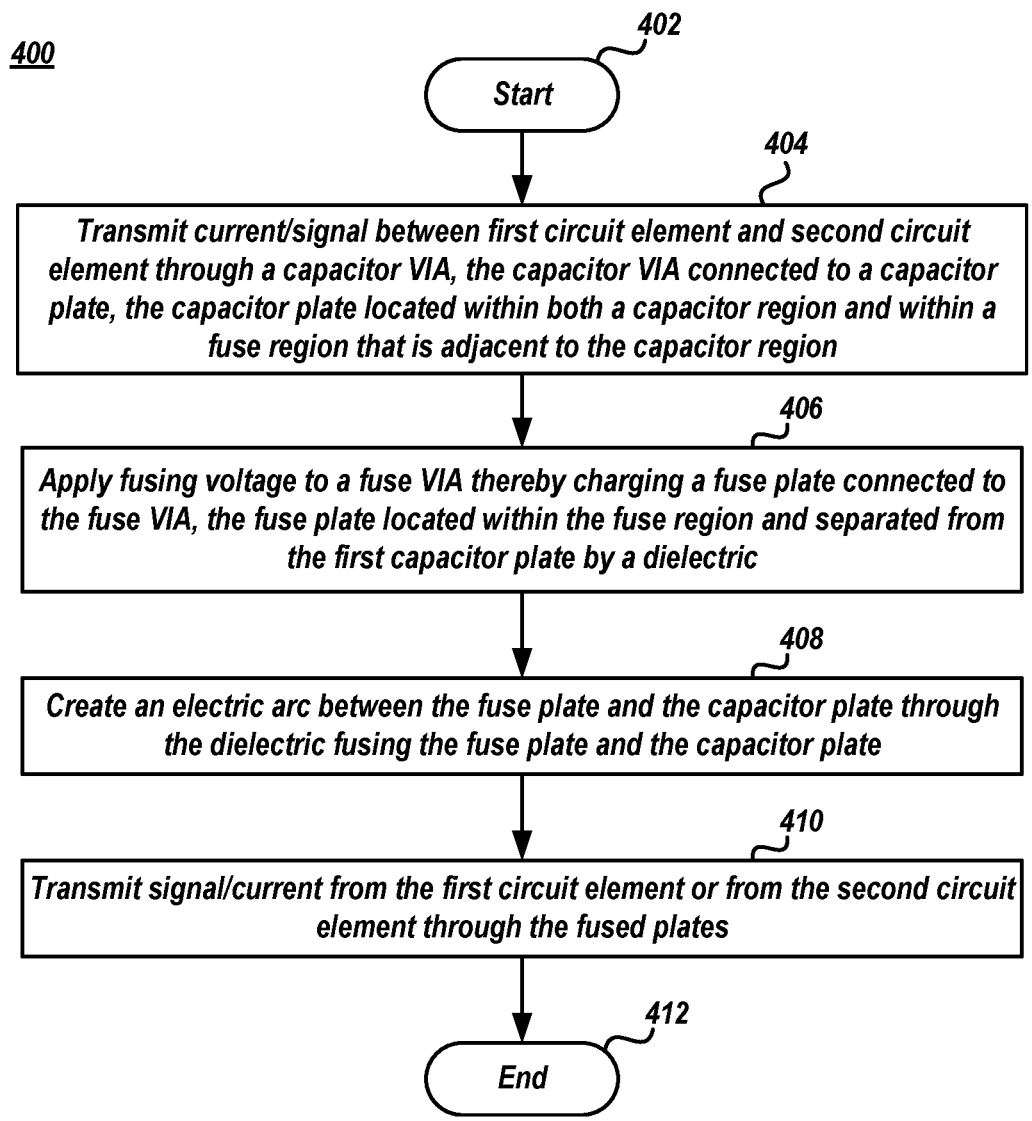
FIG. 27 depicts a method of altering current flow through an IC device by programming an on IC device integrated capacitor and anti-fuse structure, according to exemplary embodiments.

FIG. 27 depicts a method 400 of altering current flow through IC device 100 by programming an on IC device 100 integrated capacitor and anti-fuse structure, according to exemplary embodiments. Method 400 begins at block 402 and continues with transmitting a current and/or an electrical signal between a first circuit element and a second circuit element through a capacitor VIA (block 404). For example, a current and/or electrical signal is transmitted from/to external circuit element(s) $145_1$ to/from active device(s) $139_1$ by VIA $140_1$. The capacitor VIA is connected to a capacitor plate and is located within both a capacitor region and within an anti-fuse region adjacent to the capacitor region. For example, as depicted in FIG. 3, VIA $140_1$ is connected to capacitor plate 130 that is located within both capacitor region 101 and within anti-fuse region 103.

At block 402, IC device 100 integrated capacitor and anti-fuse structure operates in a first operational mode as dictated by the predetermined current flow across the capacitor VIA. For example, IC device 100 integrated capacitor and anti-fuse structure operates in a first operational mode as dictated by current flow across VIA $140_1$ from/to external circuit element(s) $145_1$ to/from active device(s) $139_1$ whereby such circuit is electrically separated or distinct from external circuit element(s) 143, $145_2$, active device(s) $139_2$, $139_3$, or the like.

Method 400 may continue with applying a fusing voltage to an anti-fuse VIA that charges an anti-fuse plated that is connected to the anti-fuse VIA (block 406). For example, the fusing voltage is applied to anti-fuse plate 135 and charges anti-fuse plate 135 which causes an electric field between the anti-fuse plate 135 and capacitor plate 130.

Method 400 may continue with creating an electric arc between the anti-fuse plate and the capacitor plate through the dielectric material that separates the anti-fuse plate and the capacitor plate (block 408). For example, the electric arc is caused by applying a fusing voltage that causes an electric field between the anti-fuse plate 135 and capacitor plate 130 to exceed a breakdown field strength of the dielectric material that separates the anti-fuse plate 135 and capacitor plate 130 in the anti-fuse 121.

The electric field may be such that causes an electric arc between the anti-fuse plate and the capacitor plate. For example, the anti-fuse plate 135 and capacitor plate 130 may fuse together to form fused plates 206. As plates 135 and 130 are fused, fused plates 206 effectively operate as a single conductor or a single electrical pathway as opposed to separate or distant electrical conductors or pathways as plates 135 and 130 were prior to fusing.

Method 400 may continue with transmitting an electrical signal and/or electrical current from the first circuit element or from the second circuit element through the fused plates (block 410. For example, an electrical signal and/or electrical current is transmitted from/to external circuit element(s) $145_1$ or active device(s) $139_1$ to/from external circuit element(s) $145_1$, 143 or to/from active device(s) $139_2$, $139_3$.

Due to the new electrical signal or current flow path across fused plates 206, functionality of the IC device 100 may be altered. Whereas prior to the programming of anti-fuse 121 electrical paths between external circuit element(s) $145_1$ and active device(s) $139_1$; between external circuit element(s) 143 and active device(s) $139_2$; and between external circuit element(s) 143 and active device(s) $139_2$ are electrically siloed or separated, the newly established electrical signal or current flow path across fused plates 206 may drive or dictate new or altered IC device 100 functionality and/or restrict or eliminate previous IC device 100 functionality. In other embodiments, the newly connected circuit elements may be redundant circuit elements that are redundant to the previously interconnected circuit elements that were connected prior to the programming of anti-fuse 121. Method 400 may end at block 412.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "forming" or the like, may include any now known or later developed techniques appropriate for the material to be fabricated, including, but not limited to: CVD, LPCVD, PECVD, semi-atmosphere CVD (SACVD), high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the IC device. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. An on integrated circuit (IC) device integrated capacitor and anti-fuse structure comprising:
    an anti-fuse region comprising an anti-fuse directly adjacent to a capacitor region comprising a capacitor;
    the anti-fuse comprising an anti-fuse plate, the anti-fuse region defined by a width of the anti-fuse plate;
    the capacitor comprising a capacitor plate that extends from within the capacitor region to within the anti-fuse region, the anti-fuse plate separated from the capacitor plate within the anti-fuse region by a dielectric, wherein front and rear surfaces of the capacitor plate within the anti-fuse region are inset from respective front and rear side surfaces of the capacitor plate within the capacitor region.

2. The structure of claim 1, wherein the capacitor plate is a metal plate within a metal-insulator-metal (MIM) capacitor.

3. The structure of claim 1, wherein the anti-fuse further comprises an anti-fuse VIA connected to the anti-fuse plate, connected to a first back end (BE) metallization stack of the IC device, and connected to a first IC device interconnect pad.

4. The structure of claim 2, wherein an electrical arc between the anti-fuse plate and the capacitor plate fuses the anti-fuse plate and the capacitor plate.

5. The structure of claim 2, wherein IC device functionality is altered by current flow across the fused anti-fuse plate and the capacitor plate.

6. The structure of claim 3, wherein the capacitor further comprises a capacitor VIA connected to the capacitor plate, connected to a second BE metallization stack of the IC device, and connected to a second IC device interconnect pad.

7. An integrated circuit (IC) device comprising:
an anti-fuse region comprising an anti-fuse directly adjacent to a capacitor region comprising a capacitor, the anti-fuse comprising an anti-fuse plate, the anti-fuse region defined by a width of the anti-fuse plate;
the capacitor comprising a capacitor plate that extends from within the capacitor region to within the anti-fuse region, the anti-fuse plate separated from the capacitor plate within the anti-fuse region by a dielectric, wherein front and rear surfaces of the capacitor plate within the anti-fuse region are inset from respective front and rear side surfaces of the capacitor plate within the capacitor region.

8. The IC device of claim 7, wherein the capacitor plate is a metal plate within a metal-insulator-metal (MIM) capacitor.

9. The IC device of claim 8, wherein the anti-fuse further comprises an anti-fuse VIA connected to the anti-fuse plate, connected to a first back end (BE) metallization stack of the IC device, and connected to a first IC device interconnect pad.

10. The IC device of claim 8, wherein an electrical arc between the anti-fuse plate and the capacitor plate fuses the anti-fuse plate and the capacitor plate.

11. The IC device of claim 7, wherein the anti-fuse plate is configured to receive a fusing voltage that causes a charge thereupon that exceeds a breakdown field strength of the dielectric and that causes the anti-fuse plate to fuse with the capacitor plate.

12. The structure of claim 1, wherein the anti-fuse plate is configured to receive a fusing voltage that causes a charge thereupon that exceeds a breakdown field strength of the dielectric and that causes the anti-fuse plate to fuse with the capacitor plate.

* * * * *